(12) United States Patent
Gill et al.

(10) Patent No.: US 12,656,406 B2
(45) Date of Patent: Jun. 16, 2026

(54) STATE-OF-HEALTH ESTIMATION PIPELINE FOR LI-ION BATTERY PACKS WITH HETEROGENEOUS CELLS

(71) Applicants: TotalEnergies OneTech SAS, Courbevoie (FR); The Regents of the University of California, Oakland, CA (US); Universite Libre De Bruxelles, Brussels (BE)

(72) Inventors: Preet Gill, El Sobrante, CA (US); Scott Moura, Berkeley, CA (US); Chitra Dangwal, Berkeley, CA (US); Dong Zhang, Albany, CA (US); Luis D. Couto, Oxford (GB); Wente Zeng, San Francisco, CA (US); Sebastien Benjamin, Leognan (FR)

(73) Assignees: TotalEnergies OneTech SAS, Courbevoie (FR); University of California—Berkeley, Berkeley, CA (US); Universite Libre De Bruxelles, Brussels (BE)

( * ) Notice: Subject to any disclaimer, the term of this patent is extended or adjusted under 35 U.S.C. 154(b) by 253 days.

(21) Appl. No.: 17/832,219

(22) Filed: Jun. 3, 2022

(65) Prior Publication Data

US 2023/0393217 A1 Dec. 7, 2023

(51) Int. Cl.
G01R 31/396 (2019.01)
G01R 31/367 (2019.01)
(Continued)

(52) U.S. Cl.
CPC ......... G01R 31/392 (2019.01); G01R 31/367 (2019.01); G01R 31/396 (2019.01); H01M 10/425 (2013.01); H01M 2010/4271 (2013.01)

(58) Field of Classification Search
CPC .. G01R 31/392; G01R 31/367; G01R 31/396; H01M 10/425; H01M 2010/4271
See application file for complete search history.

(56) References Cited

U.S. PATENT DOCUMENTS

| | | | | |
|---|---|---|---|---|
| 2010/0039116 A1* | 2/2010 | Tsenter | ............... | G01R 31/392 |
| | | | | 324/427 |
| 2014/0042973 A1* | 2/2014 | Kawahara | ................ | H02J 5/00 |
| | | | | 320/118 |

(Continued)

FOREIGN PATENT DOCUMENTS

| | | | | |
|---|---|---|---|---|
| CN | 112462270 B | * | 4/2024 | ........... G01R 31/382 |
| JP | 2023051291 A | * | 4/2023 | ........... G01R 31/382 |

(Continued)

OTHER PUBLICATIONS

Jan-ju et al. "Simulation of second-order RC equivalent circuit model of lithium battery based on variable resistance and capacitance", (Year: 2020).*

(Continued)

*Primary Examiner* — Eyob Hagos
(74) *Attorney, Agent, or Firm* — Oblon, McClelland, Maier & Neustadt, L.L.P.

(57) ABSTRACT

A method for assessing a state of health of a battery having a plurality of heterogeneous cells includes subjecting the cells of the battery to a plurality of diagnostic current pulse cycles; identifying extreme cells based upon the cycles; estimating model parameters of the extreme cells; and estimating upper and lower bounds for the estimated model parameters. Estimating model parameters includes performing a recursive least squares analysis on the extreme cells. Estimating the upper and lower bounds for the estimated model parameters includes performing a sparse Gaussian process regression using the estimated model parameters.

22 Claims, 42 Drawing Sheets

(51) Int. Cl.
  *G01R 31/392* (2019.01)
  *H01M 10/42* (2006.01)

(56) References Cited

U.S. PATENT DOCUMENTS

| | | | | |
|---|---|---|---|---|
| 2014/0103933 | A1* | 4/2014 | Gibbs | B60L 50/66 |
| | | | | 324/427 |
| 2017/0242078 | A1* | 8/2017 | Kuper | H02J 7/005 |
| 2018/0095141 | A1* | 4/2018 | Wild | H01M 10/052 |
| 2018/0306865 | A1* | 10/2018 | Verbrugge | H02J 7/0048 |
| 2019/0036356 | A1 | 1/2019 | Subbaraman et al. | |
| 2020/0269709 | A1* | 8/2020 | Herring | G01R 31/396 |
| 2021/0072323 | A1* | 3/2021 | Gering | H02J 7/0071 |
| 2021/0234386 | A1* | 7/2021 | Purkayastha | H01M 10/425 |
| 2021/0288353 | A1* | 9/2021 | Gottapu | G01R 31/367 |
| 2022/0137149 | A1* | 5/2022 | Chueh | B60L 58/12 |
| | | | | 702/63 |
| 2022/0416319 | A1* | 12/2022 | Guo | H01M 50/211 |
| 2023/0236258 | A1* | 7/2023 | Worry | H02J 7/005 |
| | | | | 324/431 |

FOREIGN PATENT DOCUMENTS

| | | | | | |
|---|---|---|---|---|---|
| WO | WO-2018090678 | A1 * | 5/2018 | ............ | G01N 29/07 |
| WO | WO-2019234390 | A1 * | 12/2019 | ....... | G01R 19/16542 |

OTHER PUBLICATIONS

Zhang et al." State of Health Estimation for Lithium-Ion Batteries Under Arbitrary Usage Using Data-Driven Multimodel Fusion" (Year: 2023).*

Xie et al., " A Facile Approach to High Precision Detection of Cell-to-Cell Variation for Li-ion Batteries", 2020 (Year: 2020).*

International Search Report and Written Opinion issued Sep. 19, 2023, in PCT/US 23/24372 citing documents 1, 2 and 24 therein, 10 pages.

Yang et al., "An online SOC and capacity estimation method for aged lithium-ion battery pack considering cell inconsistency", Journal of Energy Storage, Jun. 2020, 101250, 7 pages [Retrieved on Aug. 15, 2023) Retrieved from the Internet<URL: https://www.sciencedirect.com/science/article/abs/pii/S2352152X19311028?via%3Dihub >.

* cited by examiner

STATE-OF-HEALTH ESTIMATION PIPELINE FOR LI-ION BATTERY PACKS WITH HETEROGENEOUS CELLS

BACKGROUND OF THE INVENTION

Description of the Related Art

Battery technology plays a pivotal role in achieving global energy sustainability and reduction of greenhouse gas emissions. Due to high energy density, low self-discharging rate and long cycle life, Li-ion batteries span a wide array of applications including consumer electronics, electric vehicles and grid-level energy storage. In recent years, much emphasis has been placed on developing real-time control and estimation of a battery's internal states. However, with increasing performance demands, safe and efficient operation of Li-ion batteries remains a challenge.

Battery packs can contain up to hundreds or thousands of cells connected in series and parallel, depending on their application, such as electric vehicles and stationary grid storage. As such, it is crucial to monitor the internal states, such as state-of health (SoH), to ensure safety, performance and prolonged life. This is usually done by an advanced battery management system (BMS) that deploys real-time estimation and control schemes. However, SoH estimation in packs is challenging due to: (i) scalability and computational cost, (ii) limited sensing, and (iii) complicated battery dynamics. An important fact often ignored during battery modeling is the time-varying electrical parameters. In practice, internal parameters, e.g. resistances and capacitances, depend nonlinearly on the cell's temperature and state of charge (SoC).

SoH estimation in batteries has been typically accomplished through two different routes. The first one consists in carrying out specific experimental procedures. This is algorithmically simple but requires stoppage of battery operation and/or use specialized lab equipment. See Xinfan Lin, Hector E Perez, Shankar Mohan, Jason B Siegel, Anna G Stefanopoulou, Yi Ding, and Matthew P Castanier. A lumped-parameter electro-thermal model for cylindrical batteries. *Journal of Power Sources*, 257:1-11, 2014, incorporated herein by reference in its entirety. The second route relies on models. The model route can be divided into data-driven and physics-based approaches for battery modeling. Examples of the former type include neural networks and support vector machines used to estimate SoH parameters like capacity. See Duo Yang, Yujie Wang, Rui Pan, Ruiyang Chen, and Zonghai Chen. A neural network based state-of-health estimation of lithium-ion battery in electric vehicles. *Energy Procedia*, 105:2059-2064, 2017; and Duo Yang, Yujie Wang, Rui Pan, Ruiyang Chen, and Zonghai Chen. State-of-health estimation for the lithium-ion battery based on support vector regression. *Applied Energy*, 227: 273-283, 2018, each incorporated herein by reference in their entirety. The drawback of these approaches is that they require large data sets and do not necessarily represent the battery physics. The latter physics-based approach describes battery dynamics using first-principle electrochemical models or electrical circuit analogies. Electrochemical models have been used to estimate SoH via the Levenberg-Marquardt method, Kalman filters, and Lyapunov methods, for instance. See Shriram Santhanagopalan, Qi Zhang, Karthikeyan Kumaresan, and Ralph E. White. Parameter estimation and life modeling of lithium-ion cells. *Journal of The Electrochemical Society*, 155(4): A345-A353, 2008; S. K. Rahimian, S. Rayman, and R. E. White. State of charge and loss of active material estimation of a lithium ion cell under low earth orbit condition using kalman filtering approaches. *Journal of The Electrochemical Society*, 159(6): A860A872, 2012; and Dong Zhang, Satadru Dey, Luis D Couto, and Scott J Moura. Battery adaptive observer for a single-particle model with intercalation-induced stress. *IEEE transactions on control systems technology*, 28(4): 1363-1377, 2019, each incorporated herein by reference. Although electrochemical models are relatively descriptive, they are difficult to identify given their sheer number of parameters and associated identifiability issues. See S. Santhanagopalan, Q. Guo, P. Ramadass, and R. E. White. Review of models for predicting the cycling performance of lithium ion batteries. *Journal of Power Sources*, 156(2):620-628, 2006; and A. M. Bizeray, J. Kim, S. R. Duncan, and D. A. Howey. Identifiability and parameter estimation of the single particle lithium-ion battery model. *IEEE Transactions on Control Systems Technology*, 27(5):1862-1877, 2019, each incorporated herein by reference in their entirety. They also tend to be complex nonlinear differential-algebraic equation systems. In contrast, equivalent circuit models (ECMs) are abstractions of the battery dynamics that strike a good balance between simplicity and ease of interpretation. Parameter estimation in ECMs includes nonlinear curve fitting, genetic algorithms, least-squares method and Kalman filters, for example. See Z. Pei, Zhen Peng Xiaoxu Zhao, Huimei Yuan, and Lifeng Wu. An equivalent circuit model for lithium battery of electric vehicle considering self-healing characteristic. *Journal of Control Science and Engineering*, 2018:5179758, 2018; H. He, R.; Xiong, and J. Fan. Evaluation of lithium-ion battery equivalent circuit models for state of charge estimation by an experimental approach. *Energies*, 4:582-598, 2011; D. Zhang, S. Dey, H. E. Perez, and S. J. Moura. Remaining useful life estimation of lithium-ion batteries based on thermal dynamics. In 2017 *American Control Conference (ACC)*, pages 4042-4047, 2017; Xiangwei Guo, Longyun Kang, Yuan Yao, Zhizhen Huang, and Wenbiao Li. Joint estimation of the electric vehicle power battery state of charge based on the least squares method and the kalman filter algorithm. *Energies*, 9(2):100, 2016, each incorporated herein by reference in their entirety.

Most of the aforementioned efforts for SoH estimation have been centered around single cells, whereas few studies estimate parameters for interconnected cells in battery packs. For instance, Kalman filters were employed for combined SoC and SoH estimation in the context of equivalent circuit models, whereas global optimization approaches and particle filters also demonstrated high estimation accuracy. See Gregory L. Plett. Extended kalman filtering for battery management systems of lipb-based hey battery packs: Part 3. state and parameter estimation. *Journal of Power Sources*, 134(2):277-292, 2004; Xu Zhang, Yujie Wang, Duo Yang, and Zonghai Chen. An on-line estimation of battery pack parameters and state-of-charge using dual filters based on pack model. *Energy*, 115:219-229, 2016; Hongbin Ren, Yuzhuang Zhao, Sizhong Chen, and Taipeng Wang. Design and implementation of a battery management system with active charge balance based on the soc and soh online estimation. *Energy*, 166:908-917, 2019; Xu Zhang, Yujie Wang, Chang Liu, and Zonghai Chen. A novel approach of battery pack state of health estimation using artificial intelligence optimization algorithm. *Journal of Power sources*, 376:191-199, 2018; and Jun Bi, Ting Zhang, Haiyang Yu, and Yanqiong Kang. State-of-health estimation of lithium-ion battery packs in electric vehicles based on genetic resampling particle filter. *Applied energy*, 182:558-

568, 2016, each incorporated herein by reference in their entirety. However, most of these approaches (i) lump the entire pack as one single virtual cell thereby losing critical cell heterogeneity information, or (ii) enforce one estimator on each in-pack cell and hence impose tremendous amount of computational burden. The estimation of parameters for every single cell in a battery pack of thousands of cells using highly non-linear and coupled dynamics is computationally intractable.

Field of the Invention

The present invention is directed to a method and system to estimate parameter value bounds as a function of SoC and temperature. The method and system advantageously uses sparse Gaussian process regression and is scalable, since the upper and lower bounds of all electrical parameters are derived for all cells in a pack. Moreover, the sparse Gaussian process regression estimates parameter values from selected operating points to all the operating points of the battery pack. The method and system can intelligently poll representative cells in a battery pack.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 11A-110 are graphs illustrating feature analysis for Q based on the voltage responses to the diagnostic current profile shown in FIG. 5;

FIGS. 12A-120 are graphs illustrating feature analysis for $R_1$ based on the voltage responses to the diagnostic current profile shown in FIG. 5;

DETAILED DESCRIPTION OF THE PREFERRED EMBODIMENTS

Representative Cells are defined as cells in a battery pack whose parameters form the upper and lower bounds and enclose all the unmeasured parameters of all the cells in the pack. Furthermore, Operating Point is defined as the state of the battery pack—SoC ($\xi$(t)) and Temperature ($\Gamma$(t)) at any given time t. For the purposes of proper battery operation, the operating range is preferably set to be $\xi \in$ [20%, 100%] and $\Gamma \in$ [10° C., 60° C.].

Figure 1:
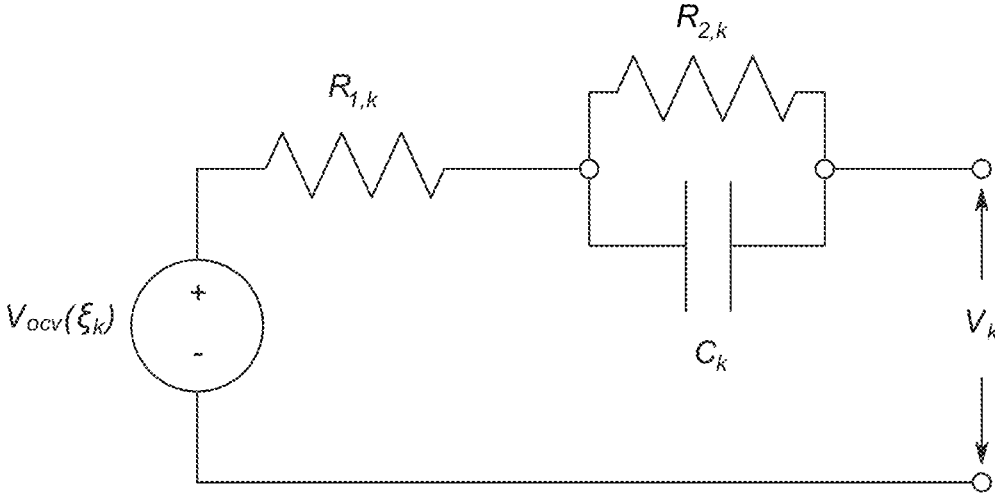
FIG. 1 shows an equivalent circuit model of a battery cell.

An equivalent-circuit model (ECM) for a single cell of the pack is shown in FIG. 1. $R_1$ represents an equivalent ohmic internal resistance and the resistor-capacitor parallel network where $R_2$ is the equivalent polarization resistance and C is the equivalent polarization capacitance. Cells are electrically interconnected to form a series arrangement. The ECM for a single cell indexed k, consisting of a resistor in series with an R-C pair and an open-circuit voltage (OCV), is defined by $$\dot{\xi}_k(t) = \frac{1}{Q_k} I_k(t), \tag{1}$$

$$\dot{V}_{c,k}(t) = \frac{1}{C_k(\xi_k), \Gamma_k} I_k(t) - \frac{1}{R_{2,k}(\xi_k, \Gamma_k) C_k(\xi_k, \Gamma_k)} V_{c,k}(t), \tag{2}$$

$$V_k(t) = V_{OCV}(\xi_k, \Gamma_k) + V_{c,k}(t) + I_k(t) R_{1,k}(\xi_k, \Gamma_k), \tag{3}$$

Here $\xi_k$(t) represents the SoC for the k-th cell, $V_{c,k}$(t) denotes the voltage across the $R_{2,k}$-$C_k$ pair, $R_{1,k}$ is the ohmic resistance, and $\Gamma_k$ is the cell temperature. The electrical model parameters, namely $R_{1,k}$, $R_{2,k}$ and $C_k$ are a function of cell SoC and temperature. Cell capacity $Q_k$ (given in Amphours, Ah) is a constant. The output (Eqn. 3) for any cell k in a pack expresses the relationship between the terminal voltage and open circuit voltage ($V_{ocv}$, a nonlinear function of SoC), voltage across resistor $R_{1,k}$, and voltage across the $R_{2,k}$-$C_k$ pair. Positive current is specified for charging and negative for discharging.

Cell heterogeneity with respect to electrical parameters $R_1$, $R_2$, C and Q is typically estimated using an open-loop simulation study. See, for example, Dong Zhang, Luis D Couto, Preet S Gill, Sebastien Benjamin, Wente Zeng, and Scott J Moura "Thermal-enhanced adaptive interval estimation in battery packs with heterogeneous cells" *IEEE Transactions on Control Systems Technology,* 2021; and Dong Zhang, Luis D Couto, Preet Gill, Sebastien Benjamin, Wente Zeng, and Scott J Moura "Interval observer for soc estimation in parallel-connected lithium-ion batteries" 2020 *American Control Conference (ACC),* pages 1149-1154, IEEE, 2020, each incorporated herein by reference in their entirety. All cells in a battery pack are considered to have an identical SoC-OCV relationship and the heterogeneity comes from a difference in electrical parameters, a difference in SoC initialization, and a difference in capacity Q.

Figure 2:
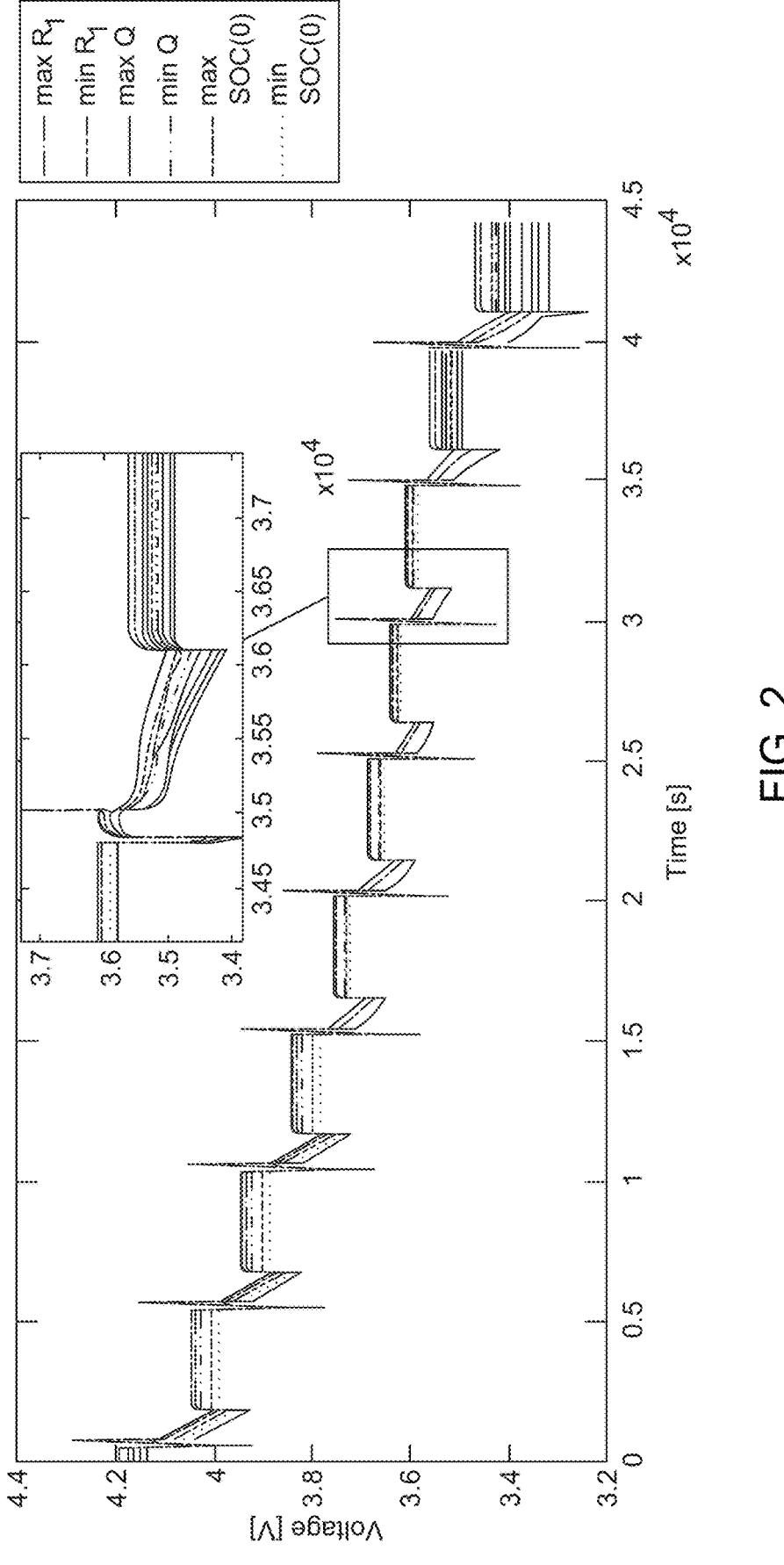
FIG. 2 shows the voltage response of a battery pack heterogeneous in electrical parameters $R_1$, $R_2$, Q and initial SoC when an HPPC current profile is applied.

As a comparison study, the inventors applied a modified Hybrid Pulse Power Characterization (HPPC) test cycle at a temperature of 30° C., as shown in FIG. 2, to a battery pack with 50 cells in series. The HPPC cycle was used to determine the dynamic performance characteristics of a battery. This testing determines battery power capability over the cell's usable voltage range. The test profile incorporates a discharge pulse followed by a regeneration pulse that take place at various SOC, and which can be performed under various temperature stressors and current loads. A discharge pulse is a relatively short load drawn on the battery, and a regeneration pulse is a relatively short charge to the battery. In the test cycle of FIG. 2, the discharge/regeneration pulses are repeated every $0.5 \times 10^4$ seconds and voltage curves for each of the cells are obtained as a function of input current. This profile mimics the discharge and charge that can occur on hybrid EVs during acceleration and regenerative braking. In the HPPC cycle, all three types of the aforementioned heterogeneity are applied to the pack of 50 cells, simultaneously, where the parameters and SoC are within ±5% of the fresh cell electrical parameters at 30° C., as shown in FIG. 2.

Figures 3A, 3B, 3C:
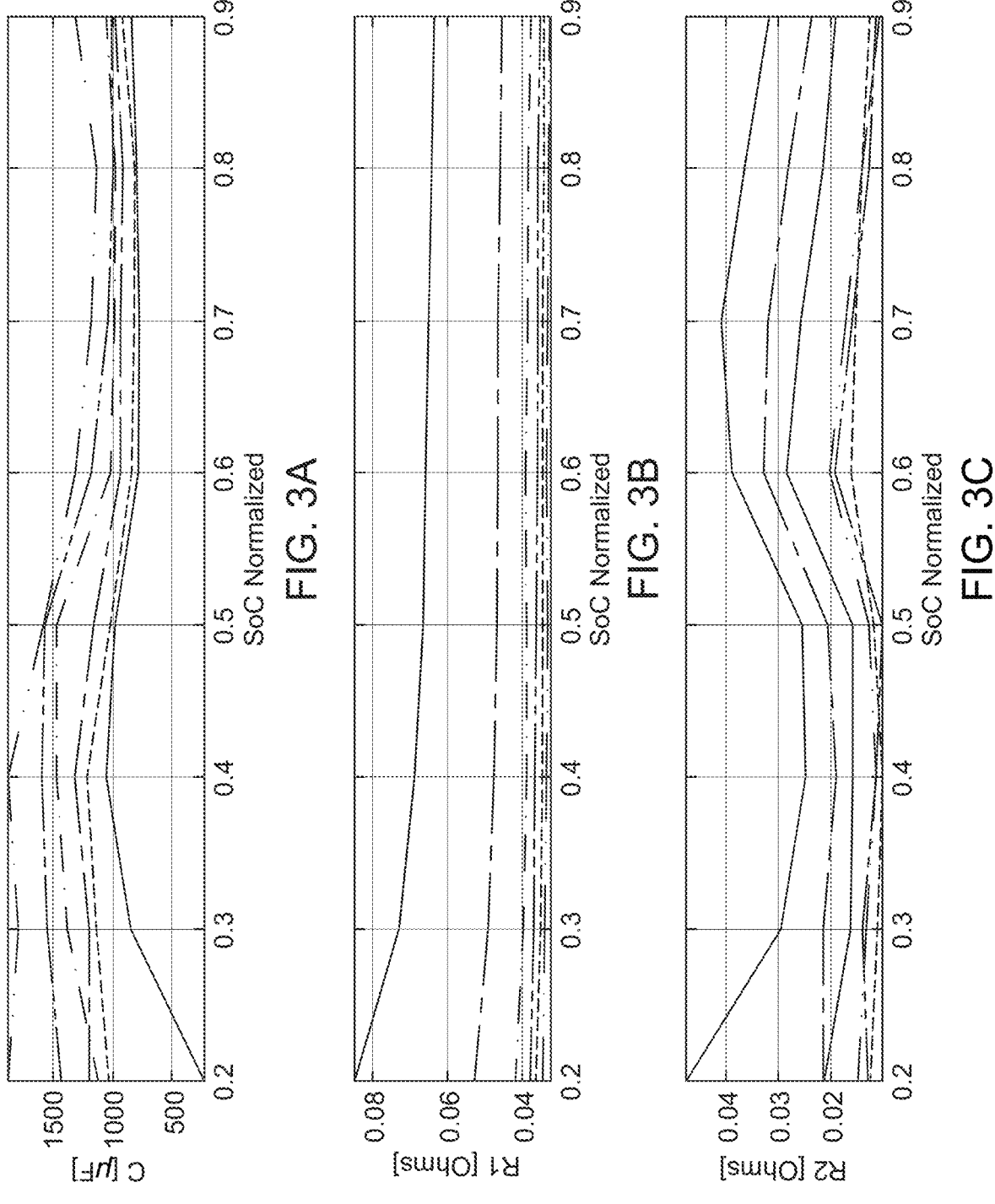
FIGS. 3A-3C are graphs showing experimental data on Li-NMC battery cells and FIG. 3D is a three-dimensional graph of $R_1$ data of a battery cell.

In a validation study, the inventors used five LiNiMn-$CoO_2$/Graphite(Li-NMC) cells in series are considered. Each cell has a 2.8Ah nominal capacity. The electrical parameters C, $R_1$ and $R_2$ as a function of $(\xi, \Gamma)$ are plotted in FIGS. 3A-C for the five cells at temperatures of 10° C. to 60° C. in 10° C. intervals and SoC between 20% and 90%. The data for the five cells is shown with SoC being normalized. The voltage response of the battery pack $V_{upper}$ and $V_{lower}$ is not strictly correlated to the "extreme" cells—defined as cells with minimum/maximum electrical parameters, and initial SoC. $V_{upper}$ is defined as the maximum voltage output of the battery pack and $V_{lower}$ is defined as the lowest voltage output of the battery pack. The cell with lowest ohmic resistance, and highest SoC-Q, does not always have the highest voltage. Similarly, the cell with highest ohmic resistance (max $R_1$) and lowest SoC (min SoC(0)) and Q (min Q) doesn't always have the lowest voltage response. Therefore, it can be concluded that using $V_{upper}$ and $V_{lower}$ as proxies for all the cells in a battery pack leads to incorrect bounds on parameter values. Moreover, in a large battery pack, the parameter values differ vastly. As such, collapsing the four dimensional parameter space to one dimension is incomplete. As is clear from the discussion above, the "reductionist" approach prevalent in the literature of collapsing a battery pack with thousands of cells to two fixed representative cells, the "strongest" and "weakest" cells with respect to voltage, leads to incorrect conclusions.

The present invention is achieved in part to address issues raised above and takes into account both (i) the heterogeneity of cells with respect to electrical parameters, and (ii) estimates parameters as a function of SoC and temperature. The invention is directed to a State-of-Health (SoH) pipeline that is divided into three parts: (i) feature analysis & cell polling, (ii) single cell electrical parameter estimation using recursive least squares (RLS), and (iii) sparse Gaussian process regression (sGPR) for estimating electrical parameters as a function of $(\xi, \Gamma)$ where $\xi \in [20\%, 100\%]$ and $\Gamma \in [10° \text{ C.}, 60° \text{ C.}]$.

Figure 3D:
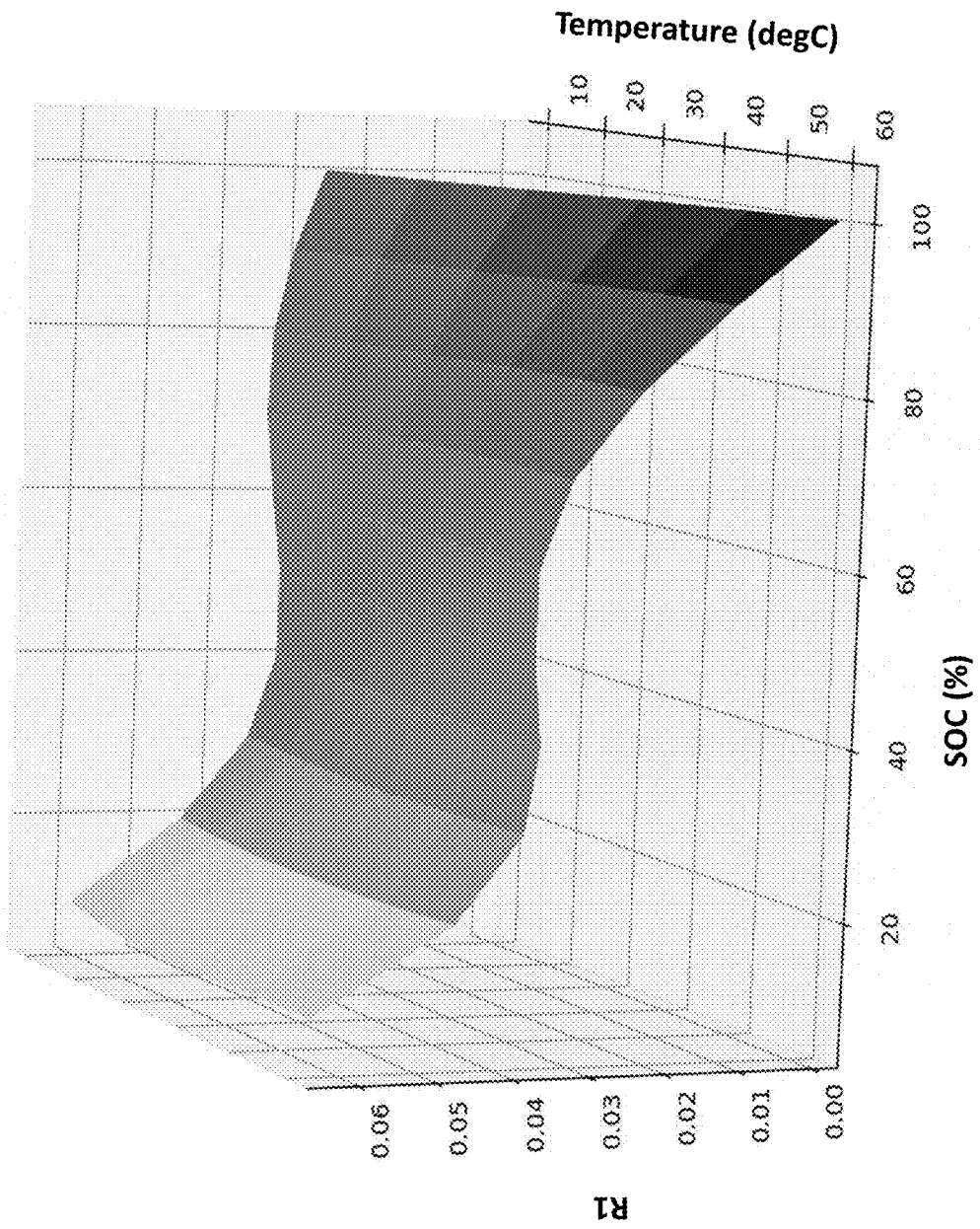

Since a battery pack consists of hundreds of thousands of cells, it is computationally intractable to estimate SoH parameters for all the cells in the pack. Therefore, a plurality of cells, for example two cells, referred to as Representative cells are identified using feature-based polling techniques defined below. The electrical parameters of the ECM model defined by Eq. (1)-(3) are a function of states SoC and Temperature. As such, first the SoH estimation is performed at a set of three discrete operating points (SoC, Temperature) using RLS and lastly, these estimates are used as input for trained sGPR algorithm to (1) obtain the mean estimate of $R_1$, $R_2$ and C for the two Representative Cells as a function of SoC and Temperature, and (2) obtain the variance of the mean estimate which provides uncertainty bounds of the estimates. An example of the final 3D surface of mean estimate of one of the Representative Cells for the parameter $R_1$ is shown in FIG. 3D. The method will be described in more detail below.

Figure 4:
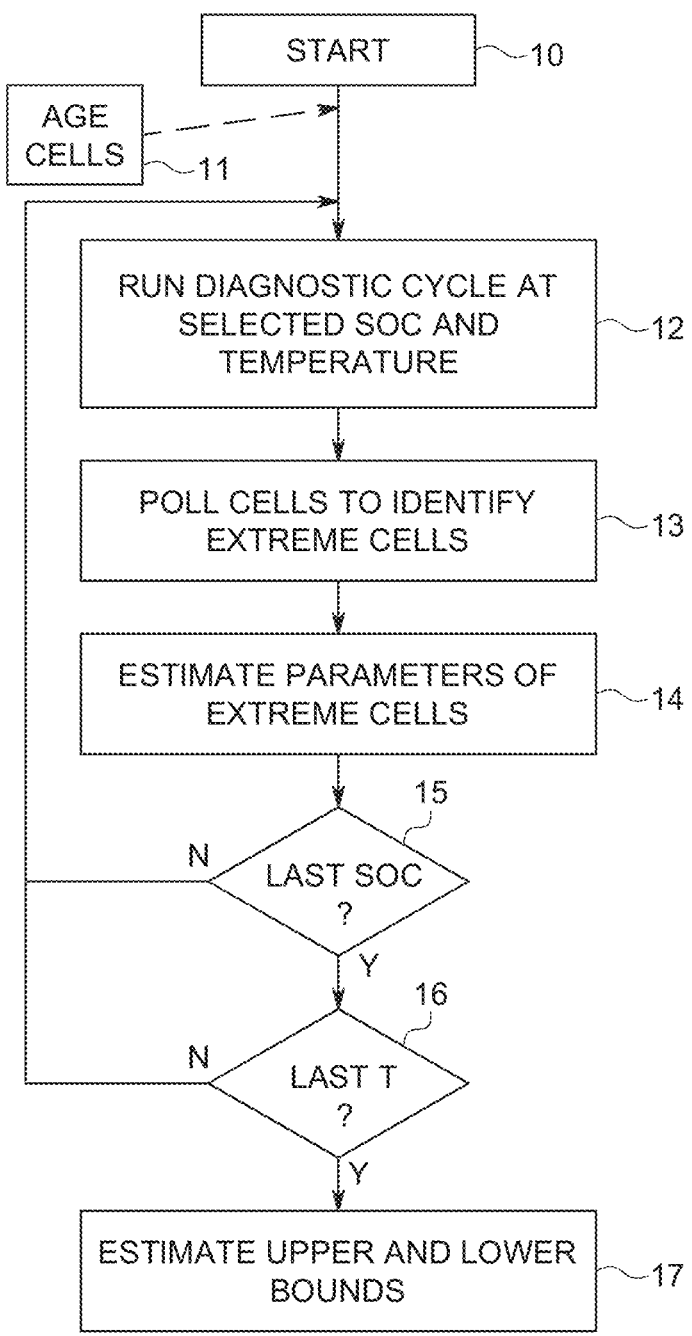
FIG. 4 is a block diagram of an embodiment of the method according to the invention.

The objective of the SoH pipeline is to estimate bounds on parameters $R_1$, $R_2$, C, Q across the pack, where the first three are functions of $(\xi, \Gamma)$. FIG. 4 shows a flow diagram of an embodiment of the method according to the invention. In step 10, the SoH pipeline begins. At step 11, if the cells of the battery are new they are optionally aged to introduce heterogeneity. This is done by varying $R_1$, $R_2$ and C by, for example, 5-7%. A diagnostic cycle (HPPC) is run a plurality of times in step 12 at a selected SoC level and temperature. For example, the cycle is run at three different SoC levels at two different temperatures for a total of six cycles. Other combinations and total times are possible such as nine $(\xi, \Gamma)$ operating points. The number of cycles is chosen based upon considerations such as the desired level of data accuracy, battery operation and cost. There is a trade-off of accuracy versus battery operation. By selecting more operating points n, the normal battery operation is restricted to n times since the diagnostic cycle is run for each operating point. However with higher n, higher accuracy is achieved with sGPR (as explained below) and vice-versa. Also, a higher number of cycles will provide more data for analysis but will require higher costs and increased testing time. The number n=3 is the number of operating points used in the invention to train the sGPR.

Next, extreme cells are identified in step 13, referred to as "polling." More particularly, the lowest and highest value of the parameters $R_1$, $R_2$, C and Q are obtained for the entire battery pack. The parameters of the extreme cells are estimated in step 14. The parameters of the representative cells are estimated using single cell online recursive least squares (RLS) with forgetting factor, described in more detail below.

Step 15 provides a run loop for each of the selected SoC levels for each temperature. The SoC values are preferably in the range of 10-100% as discussed above. When all of the selected SoC levels are yet to be completed (N at step 15), the method returns to step 12 and runs another diagnostic cycle at the next selected SoC value. When all of the diagnostic cycles at the selected SoC levels are complete for the given temperature (Y at step 15), the method proceeds to step 16. Step 16 provides a run loop for each set of SoC levels at the selected temperatures. The temperatures are preferably in the range of 20-60° C., as discussed above. When all of the selected temperatures levels are yet to be completed (N at step 15), the method returns to step 12 and runs another set of diagnostic cycles for the selected SoC levels at the next selected temperature. When all of the diagnostic cycles at the selected SoC and temperature levels are complete (Y at step 16), the method proceeds to step 17. In step 17 lower and upper bounds of the parameters are estimated, preferably using Gaussian Process Regression. The upper bound and lower bound estimates of representative cells for all of the operating points are used to estimate an upper and lower bound parametric surface in $\mathbb{R}^3$, since the electrical parameters $R_1$, $R_2$, and C are functions of ($\xi$, $\Gamma$). $\mathbb{R}^3$ is the three dimensional real valued vector space where the parameters of electrical model namely $R_1$, $R_2$, C reside. It should be noted that cell capacity is not a function of ($\xi$, $\Gamma$). These steps will be described in more detail below.

Cell Polling and Feature Analysis

The cell-to-cell variation in a battery pack over its lifetime is often overlooked in approaches that estimate electrical parameters representative of the entire pack. However, the representative cells that correspond to the upper (max) and lower (min) bounds of the electrical parameters vary during operation and do not necessarily correlate with the best ($V_{max}$) and worst ($V_{min}$) performing cell. Moreover, the representative cells for each electrical parameter differ and seldom overlap as seen in FIG. 2. This motivates the need for an approach that can easily identify representative cells in real-time using the measured voltage signal. In Xie et al., the authors developed "CiS"—Cells in Series approach to screen the cell to cell variation using voltage-based indexing as opposed to current capacity-based indexing. See Legiong Xie, Dongsheng Ren, Li Wang, Zonghai Chen, Guangyu Tian, Khalil Amine, and Xiangming He. A facile approach to high precision detection of cell-to-cell variation for li-ion batteries. *Energy—Scientific Reports*, 10:2045-2322, 2020, each incorporated herein by reference in its entirety. The CiS approach was shown to consistently outperform existing capacity-based approaches.

Voltage-based feature analysis is used to intelligently poll representative cells corresponding to each electrical parameter. The slope of the charge/discharge voltage curves obtained during the discharge cycle is known to provide insight on the electrical parameter values. The variation in resistance and capacity of the cells in a battery pack are directly related to variations in the voltage curve slope at the end of a pulse discharge and constant current discharge. As a result, the voltage response to a fixed pulse charge/discharge current cycle are leveraged to identify SoC-invariant voltage features that have high correlation coefficients with respect to (w.r.t.) electrical parameters. A correlation factor $\rho$ of greater than 0.9 is high. These correlation coefficients are then used to index the cells to identify the representative cells with maximum and minimum parameter values in the battery pack.

To identify the correlation coefficients, the inventors used a pack of 50 Li-NMC cells connected in series to generate voltage responses using the ECM model (FIG. 1) with varying parameters, whose values are extracted from experimental data (FIGS. 2-3). The $R_1$, $R_2$, C and Q parameters are varied ±5% from the nominal value and performed at a fixed temperature, in this example 30° C., and different SoC levels. The voltage responses are analyzed to: (i) identify voltage features that have the highest correlation factor w.r.t. to the parameters and (ii) identify the voltage features that are invariant w.r.t. SoC, i.e. they have high correlation factors at all SoC levels ($\xi \in [10\%\text{-}100\%]$). The latter is important because it provides the flexibility of intelligently polling the representative cells at any given SoC during battery pack operation.

Figure 5:
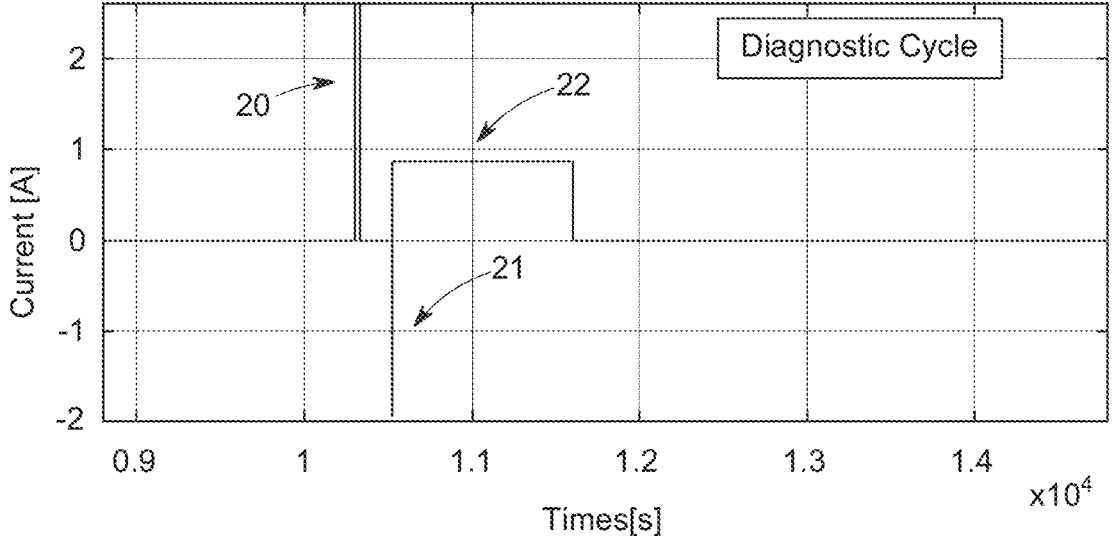
FIG. 5 is a graph illustrating the diagnostic current profile used in feature analysis.

FIG. 5 shows diagnostic pulse current profile used in the diagnostic cycle. The pulse current profile provides a discharge pulse 20 (positive current) followed by a charge (regenerative) pulse which includes a negative current portion 21 and positive current portion 22. The values of the pulses are chosen based upon the battery characteristics and testing considerations. Other voltage and timing values than those shown may be used.

Figure 6:
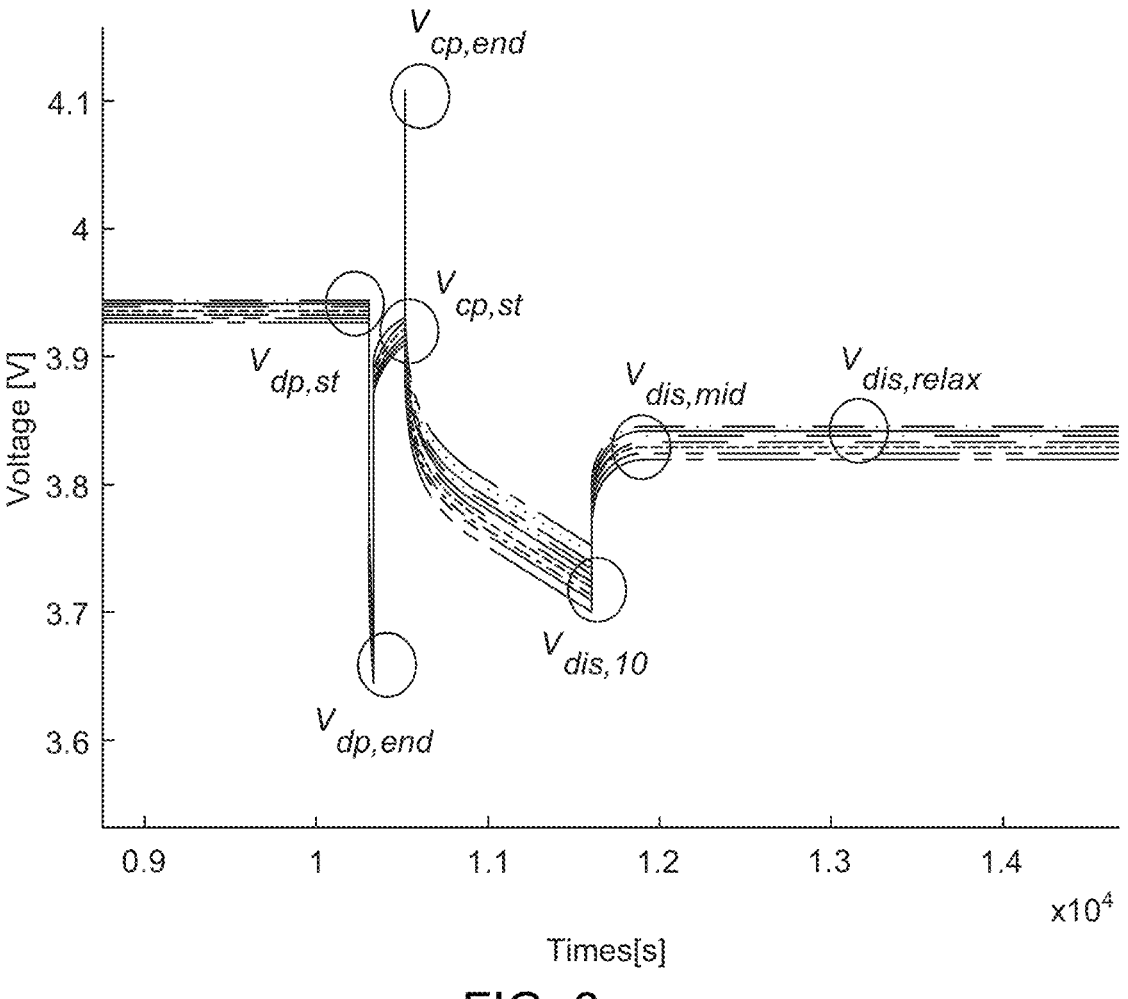
FIG. 6 is a graph showing the voltage response to the current profile of FIG. 5.
Figure 7A:
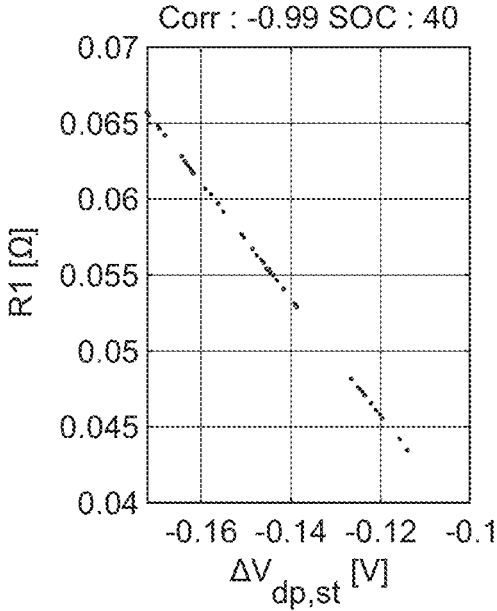
FIGS. 7A-7D are graphs illustrating feature analysis for $R_1$ based on the voltage responses to the diagnostic current profile shown in FIG. 5.
Figure 7B:
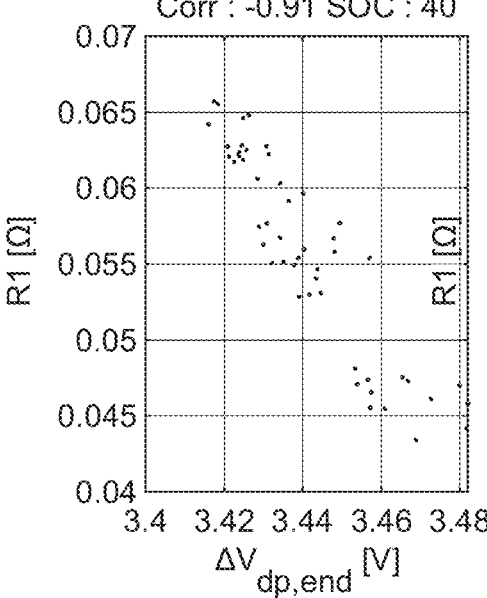
Figure 7C:
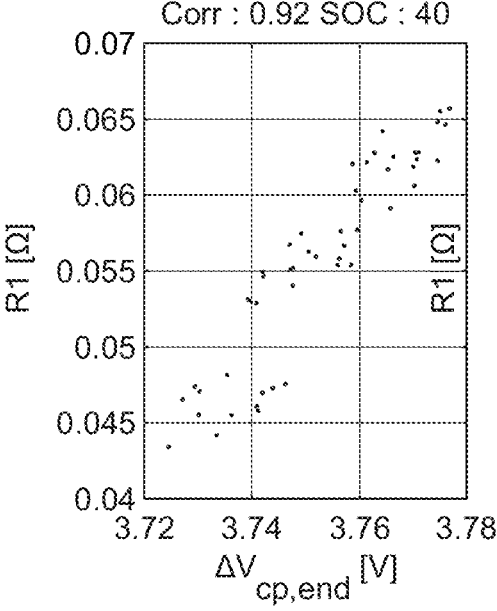
Figure 7D:
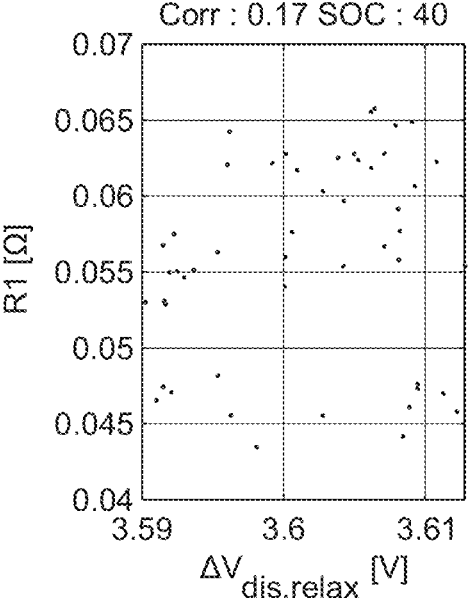
Figure 8A:
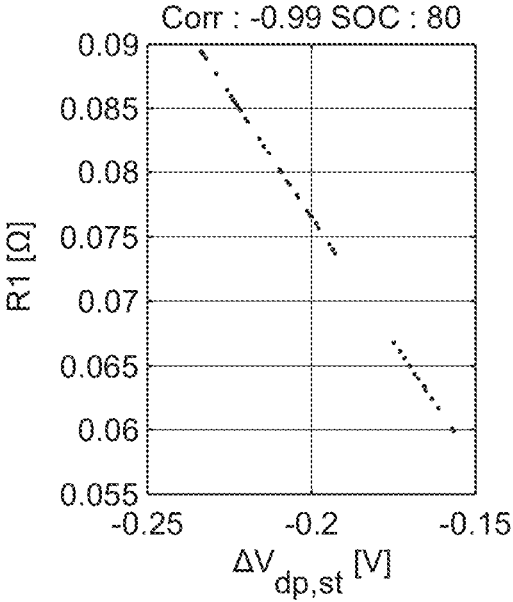
FIGS. 8A-8D are graphs illustrating feature analysis for $R_1$ based on the responses to the diagnostic current profile shown in FIG. 5
Figure 8B:
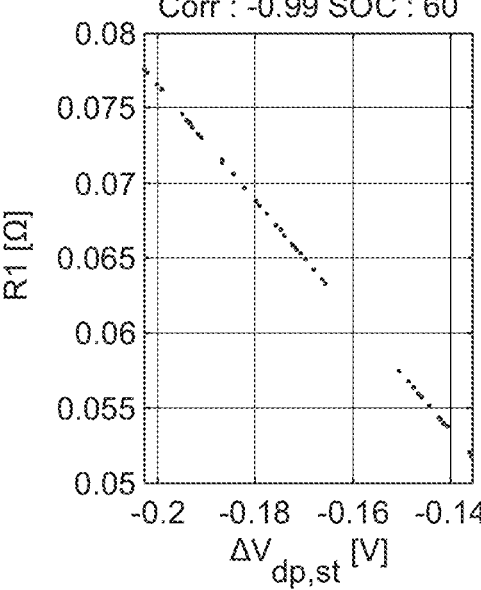
Figure 8C:
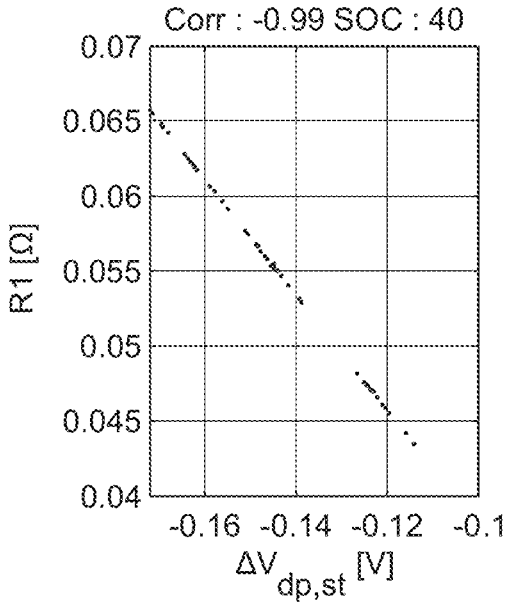
Figure 8D:
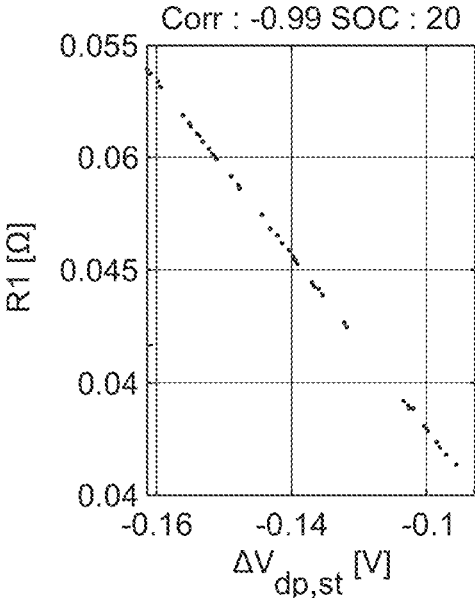
Figure 9A:
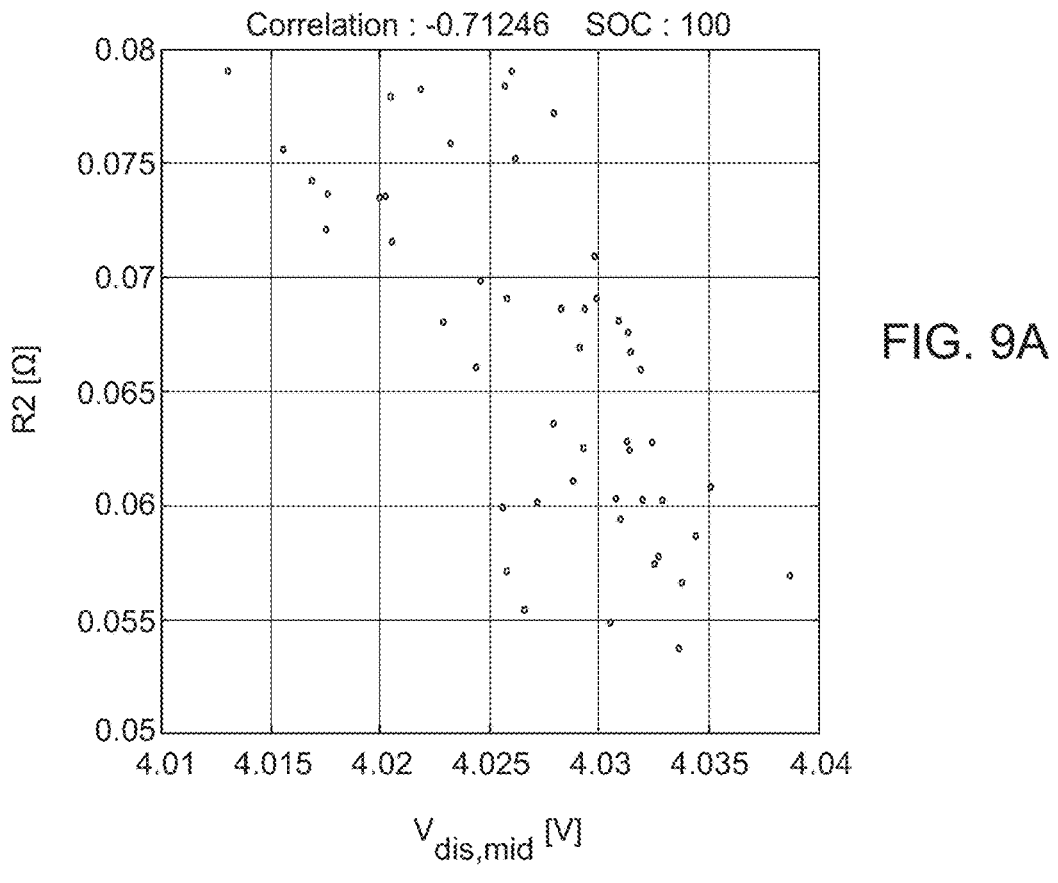
FIGS. 9A-9J are graphs illustrating feature analysis for $R_2$ based on the responses to the diagnostic current profile shown in FIG. 5.
Figure 9B:
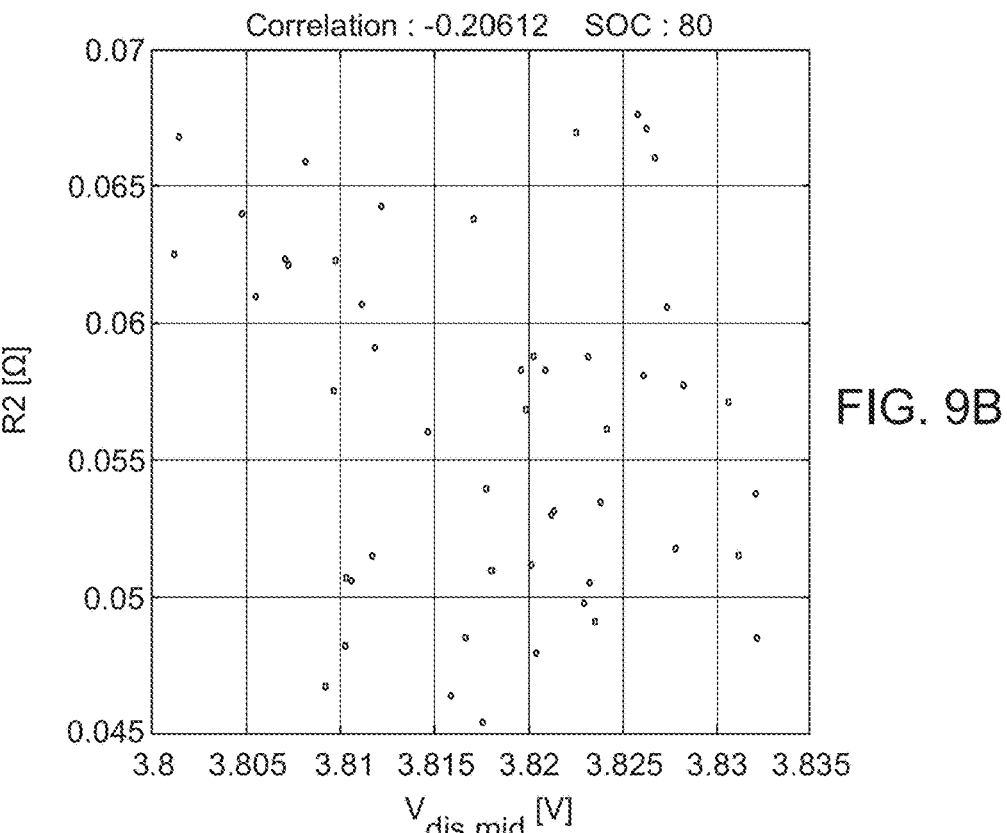
Figure 9C:
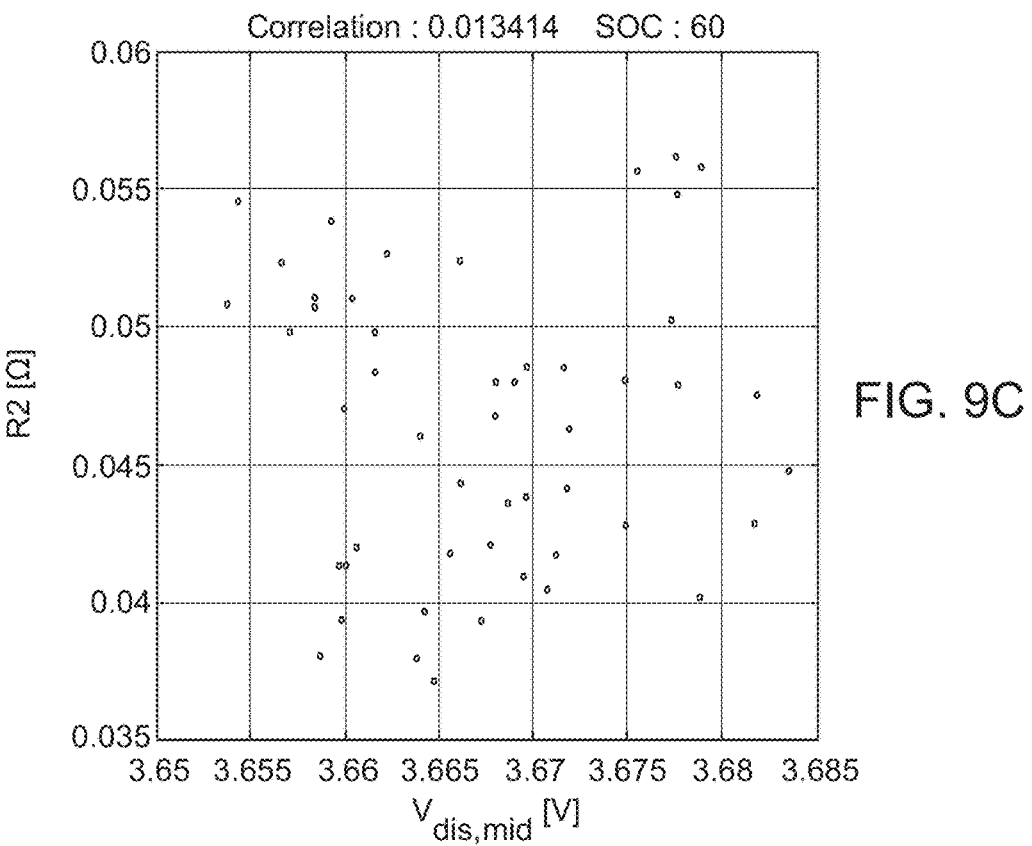
Figure 9D:
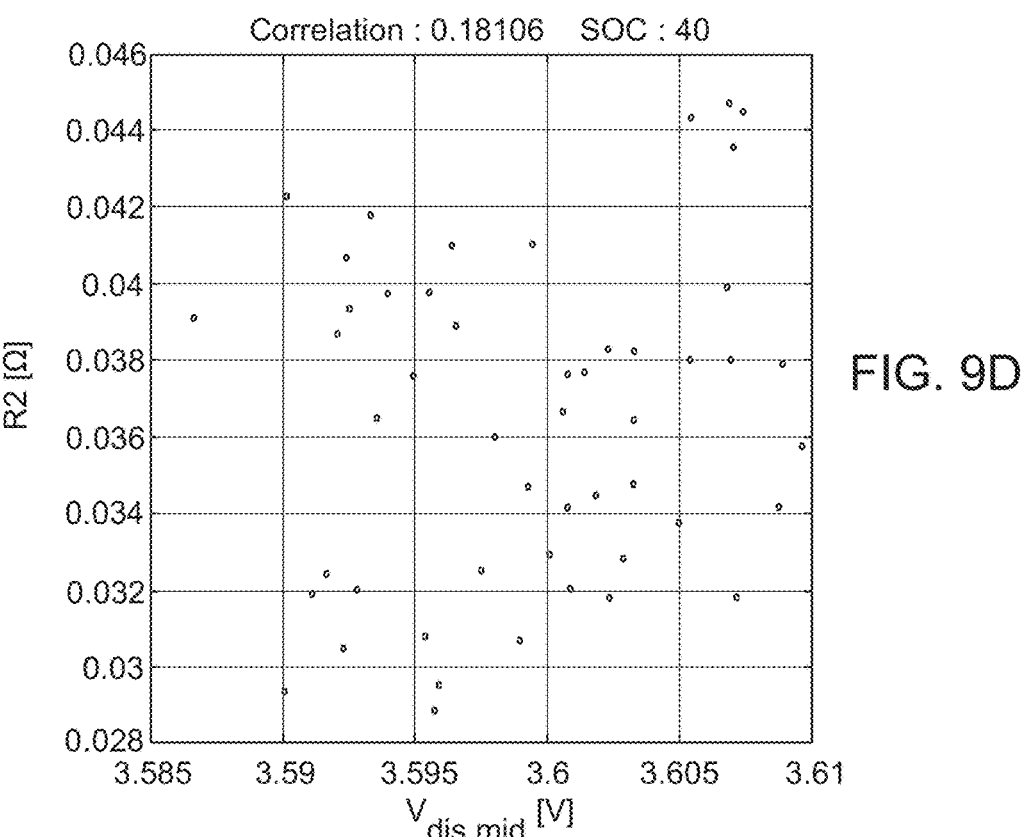
Figure 9E:
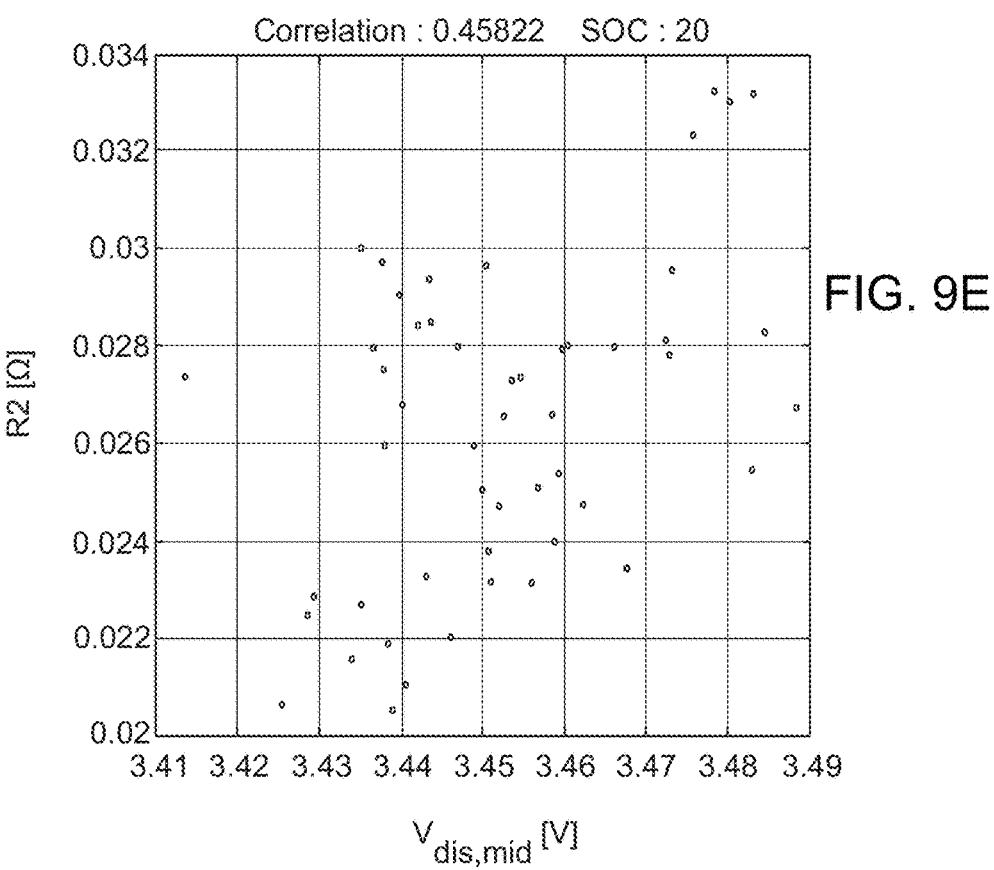
Figure 9F:
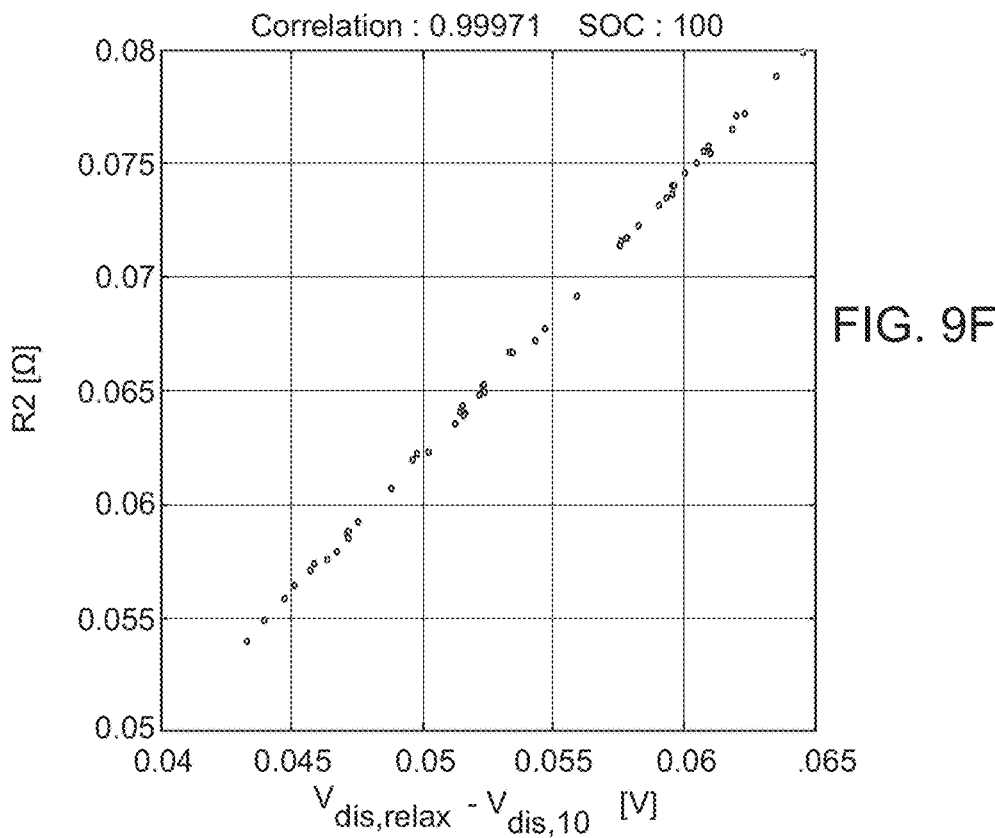
Figure 9G:
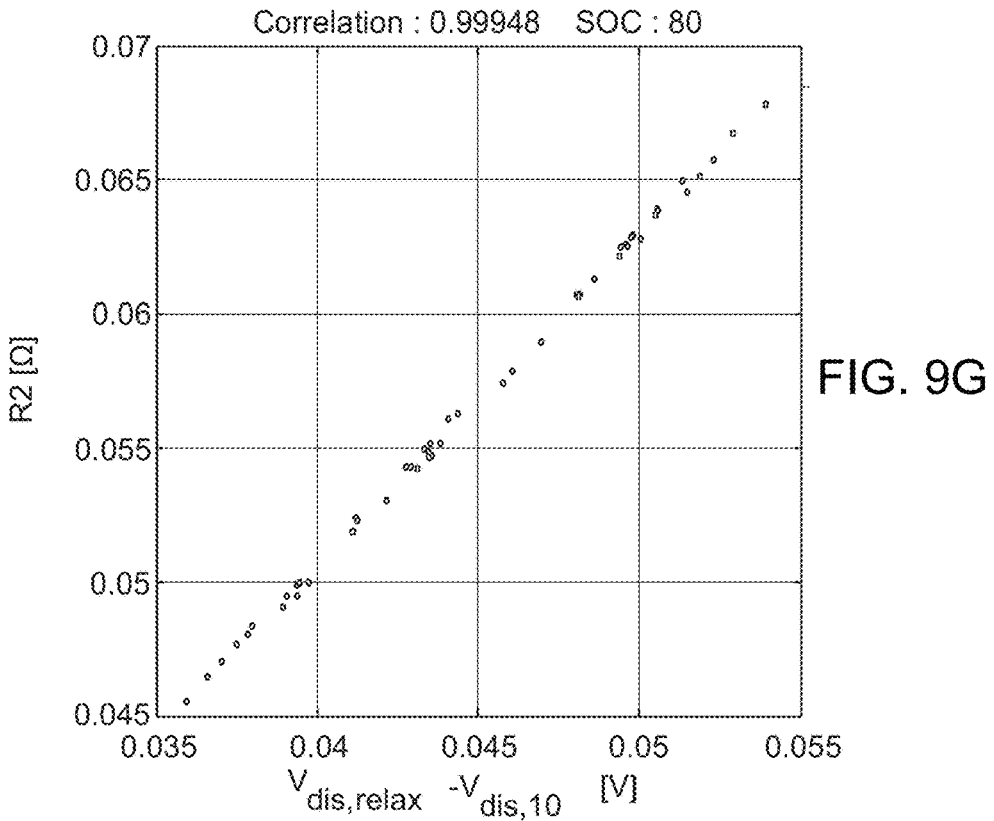
Figure 9H:
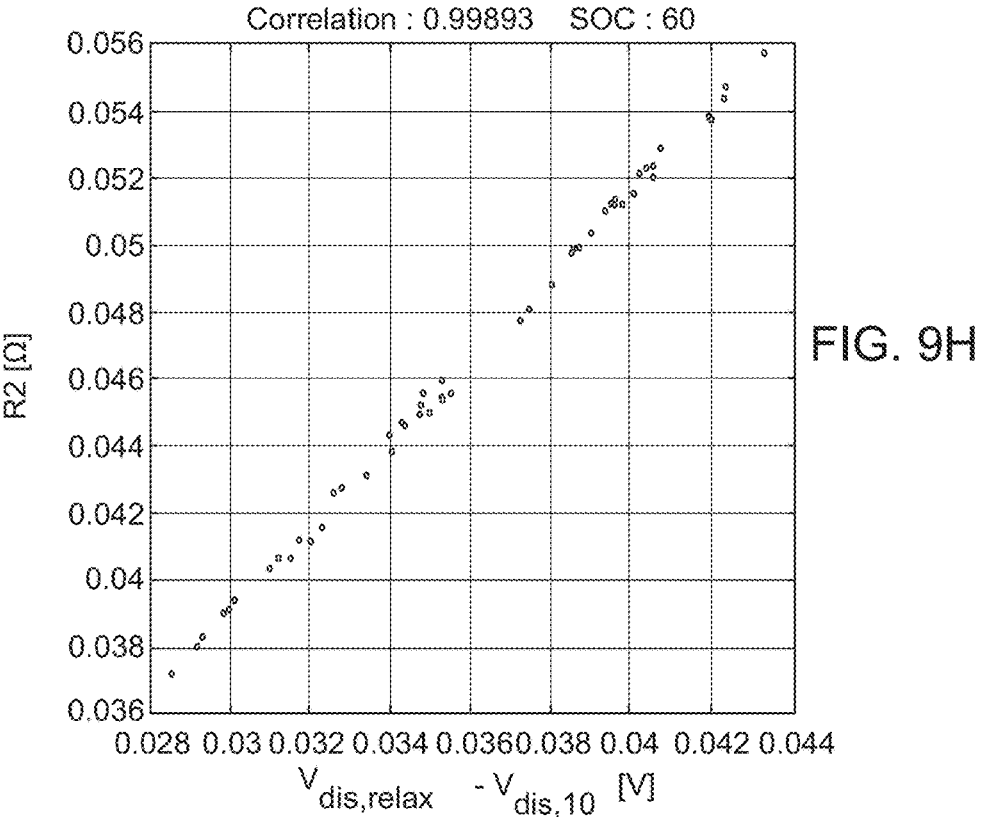
Figure 9I:
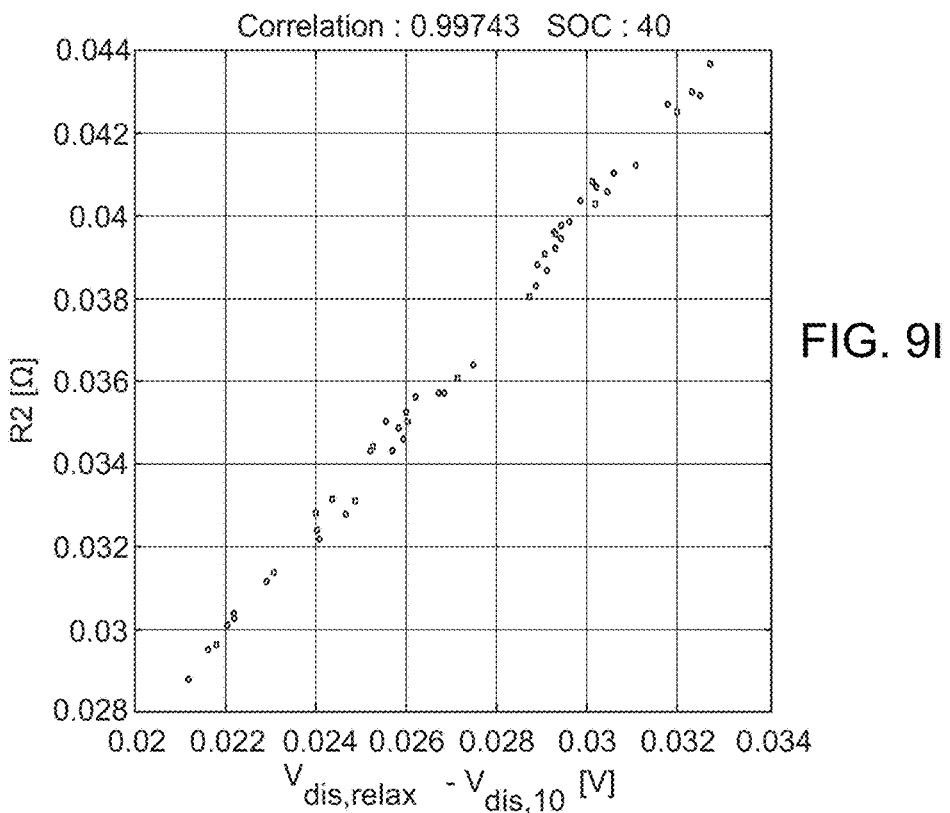
Figure 9J:
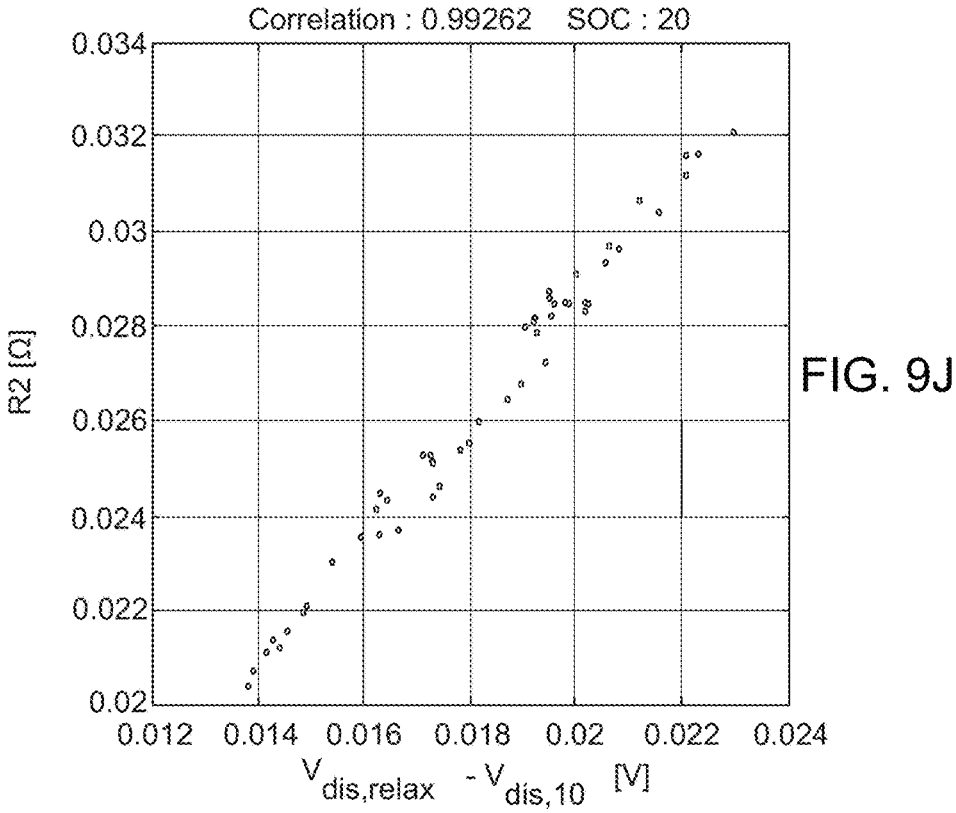
Figure 10A:
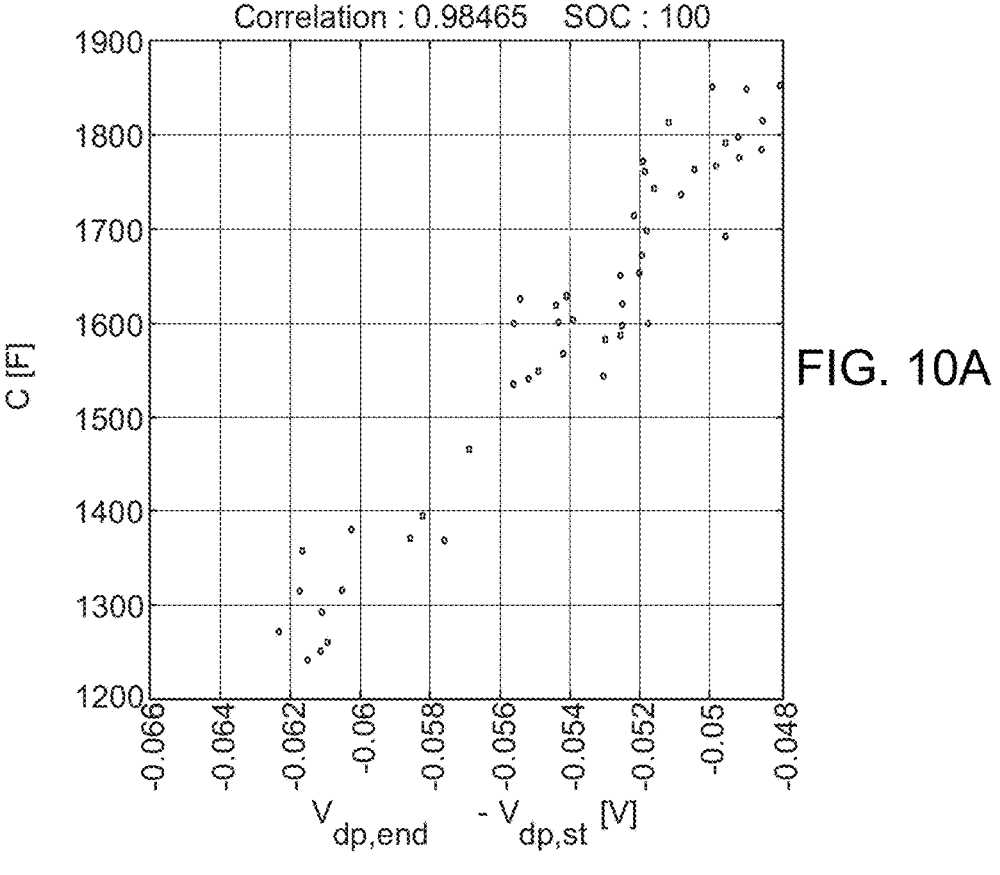
FIGS. 10A-E show graphs illustrating feature analysis for C based on the voltage responses to the diagnostic current profile shown in FIG. 5.
Figure 10B:
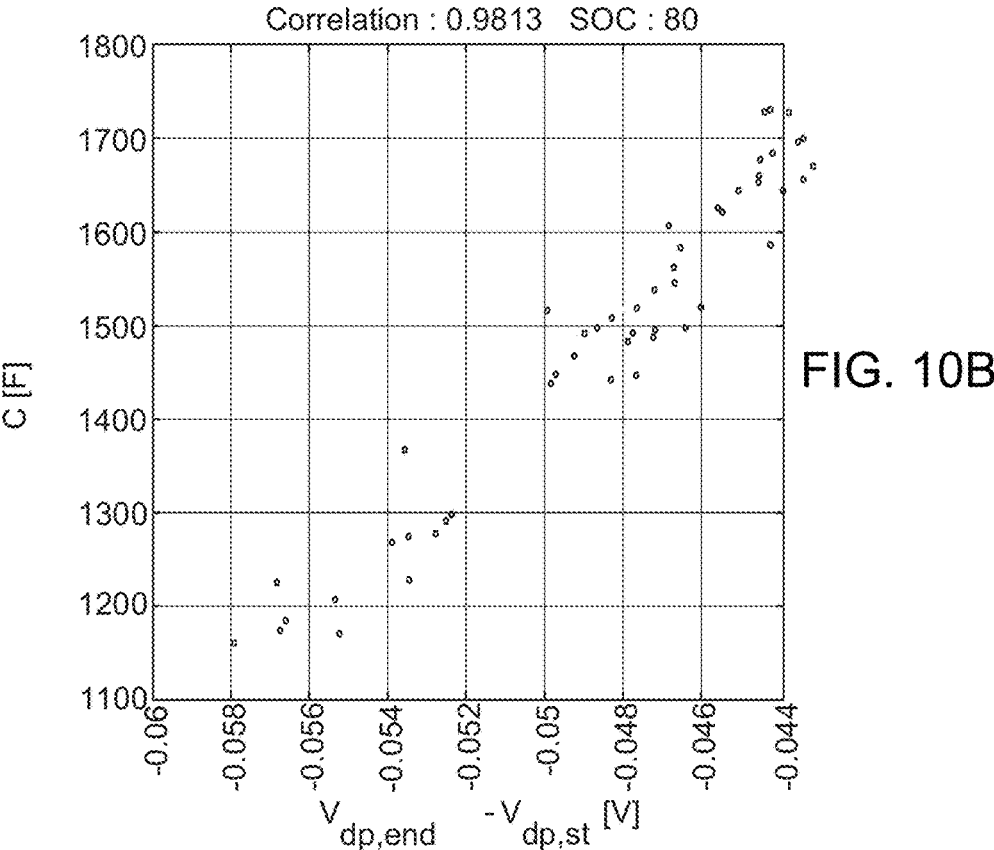
Figure 10C:
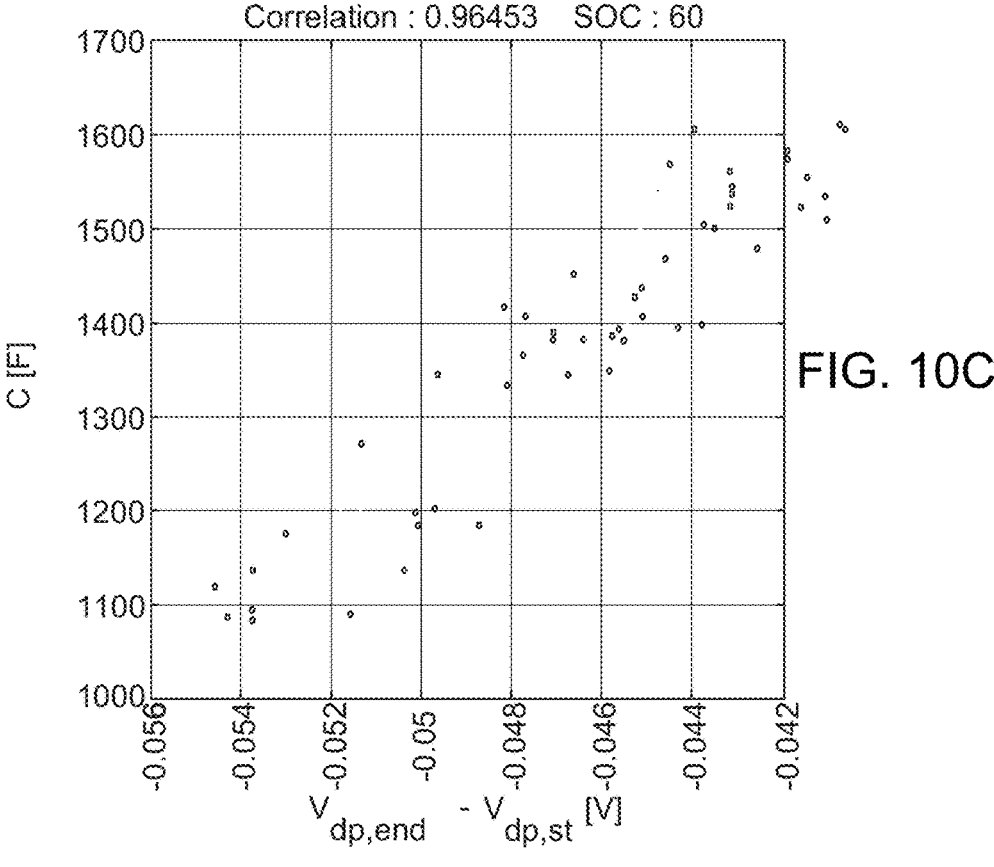
Figure 10D:
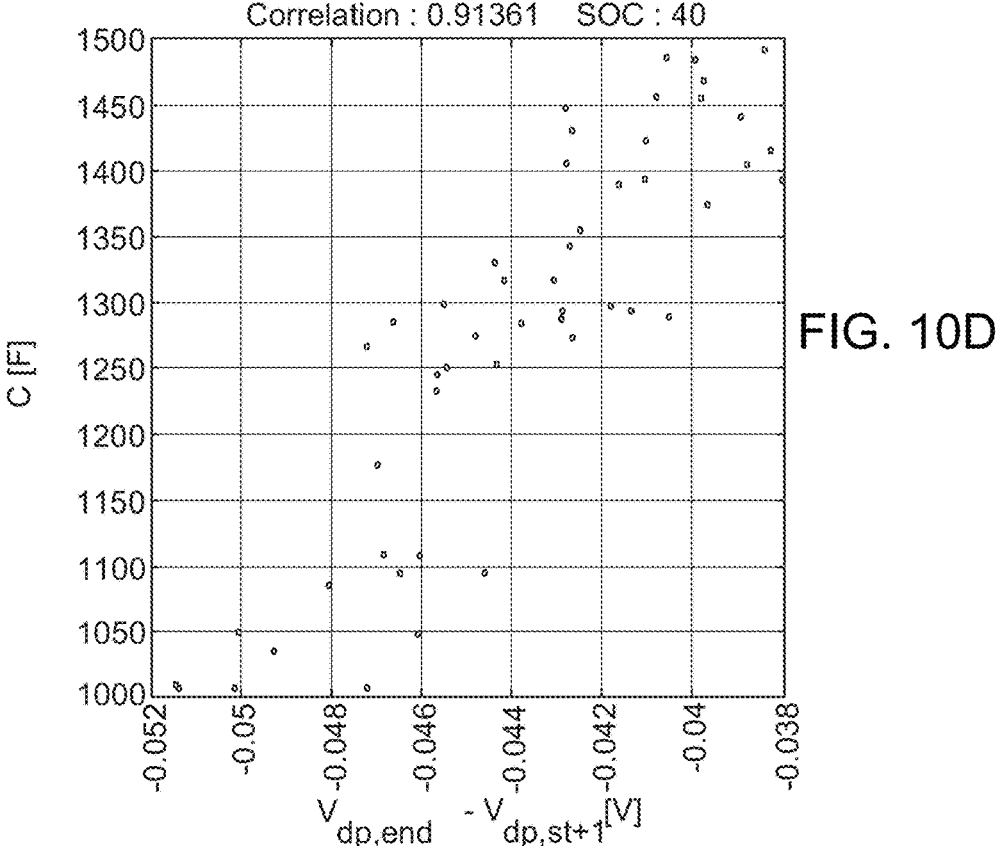
Figure 10E:
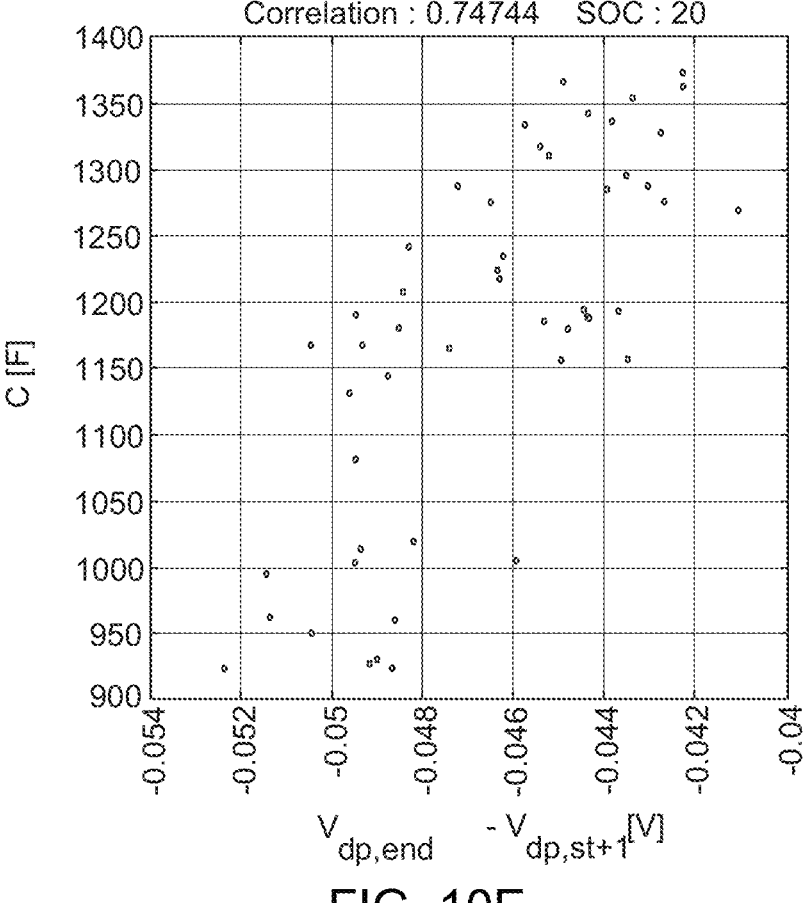
Figure 11A:
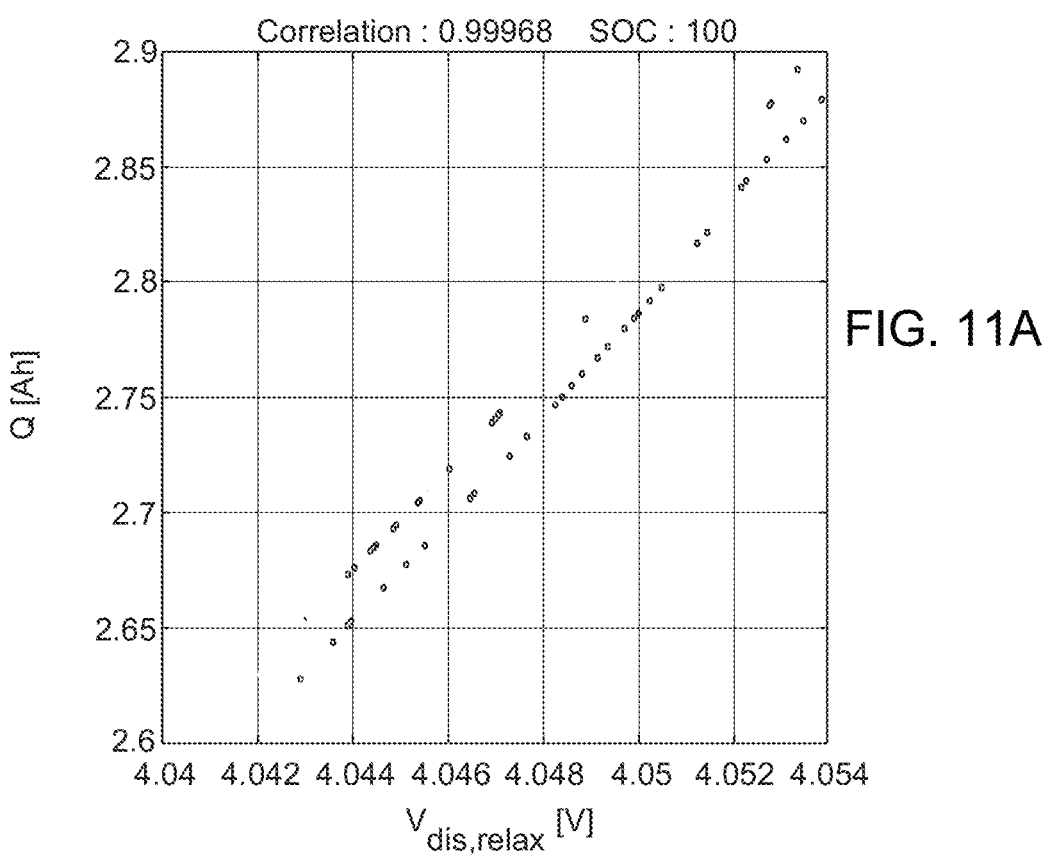
Figure 11B:
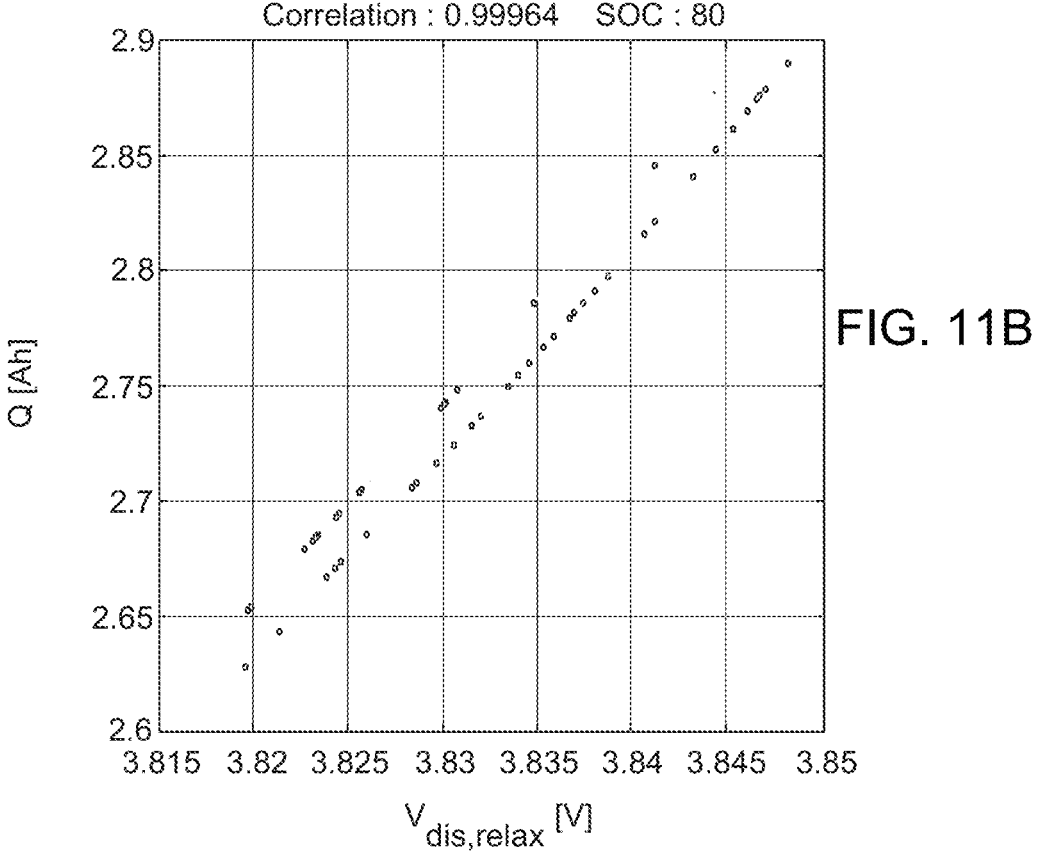
Figure 11C:
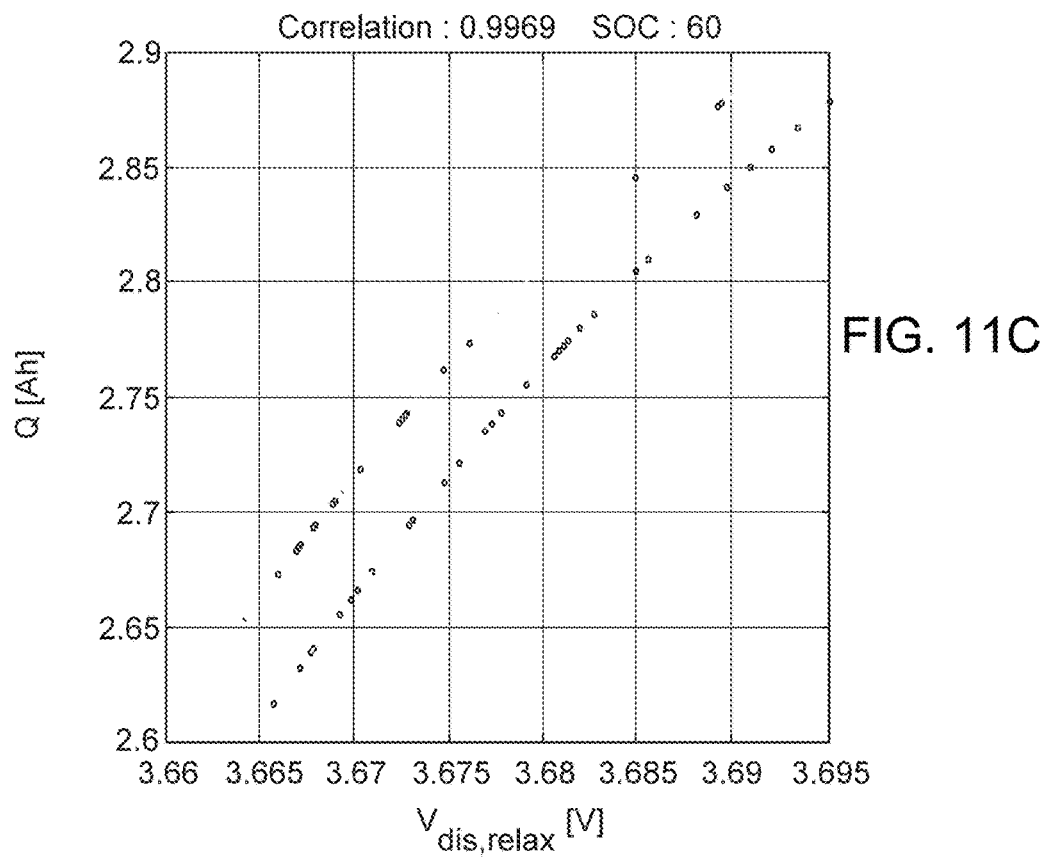
Figure 11D:
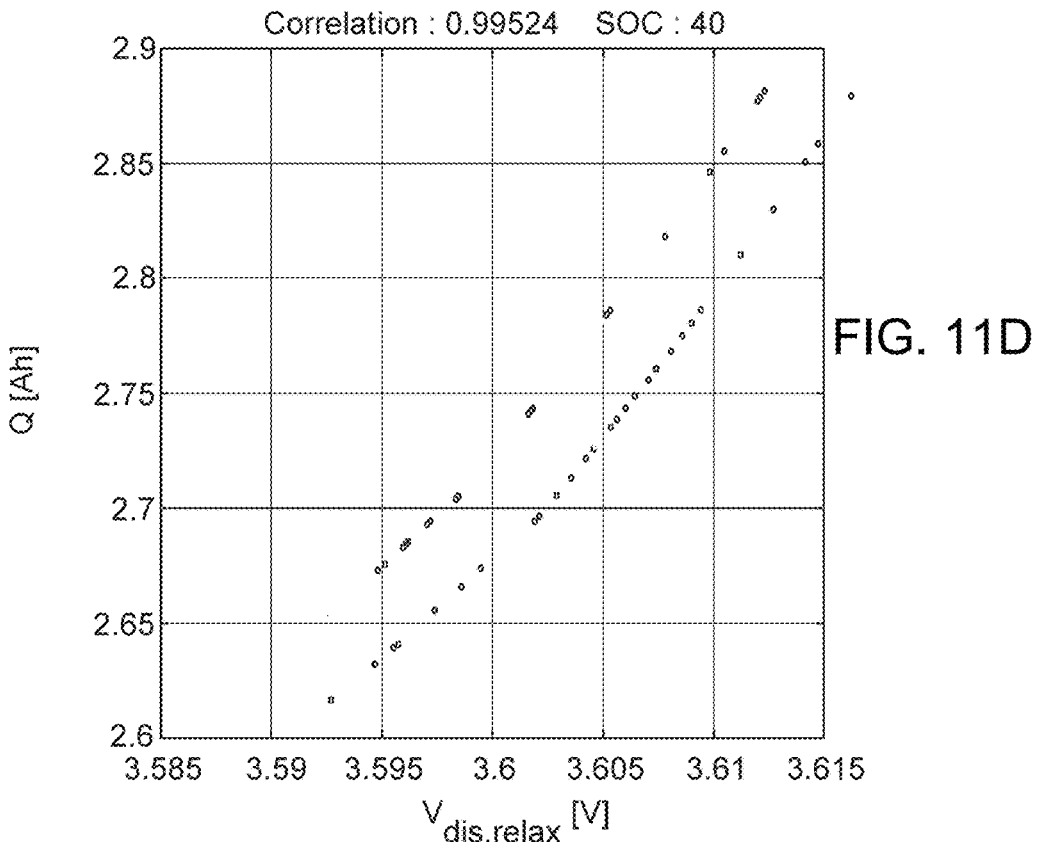
Figure 11E:
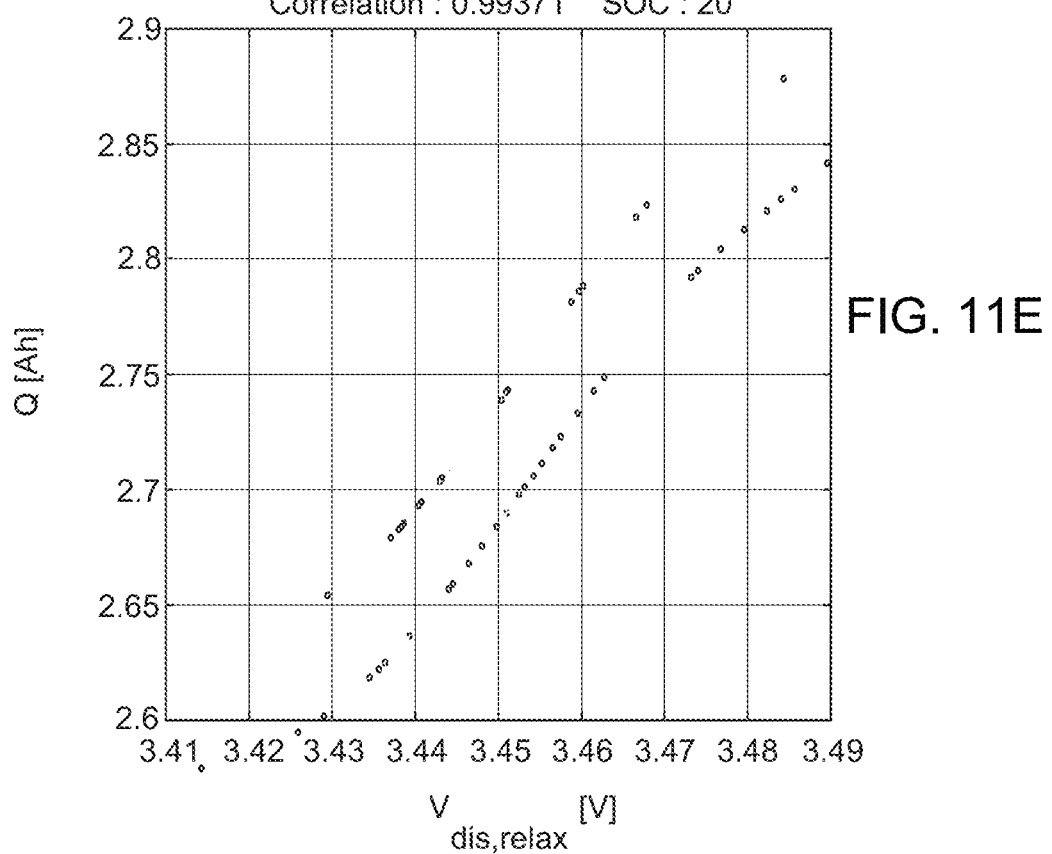
Figure 11F:
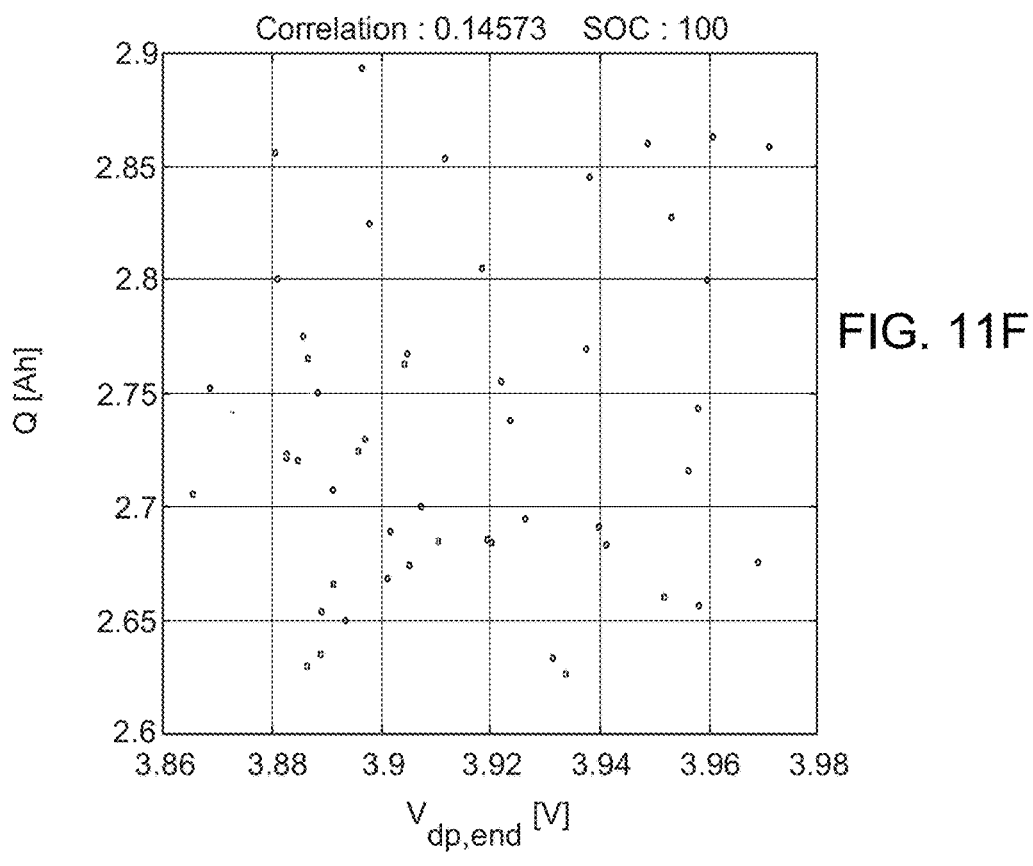
Figure 11G:
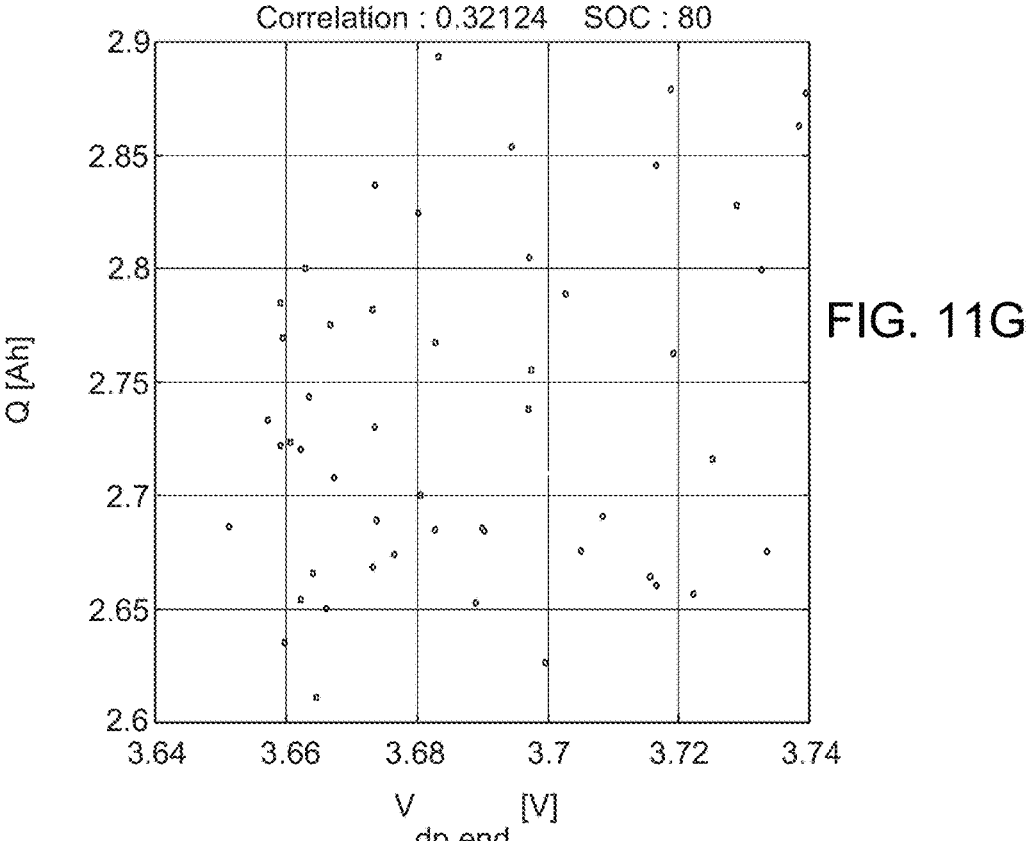
Figure 11H:
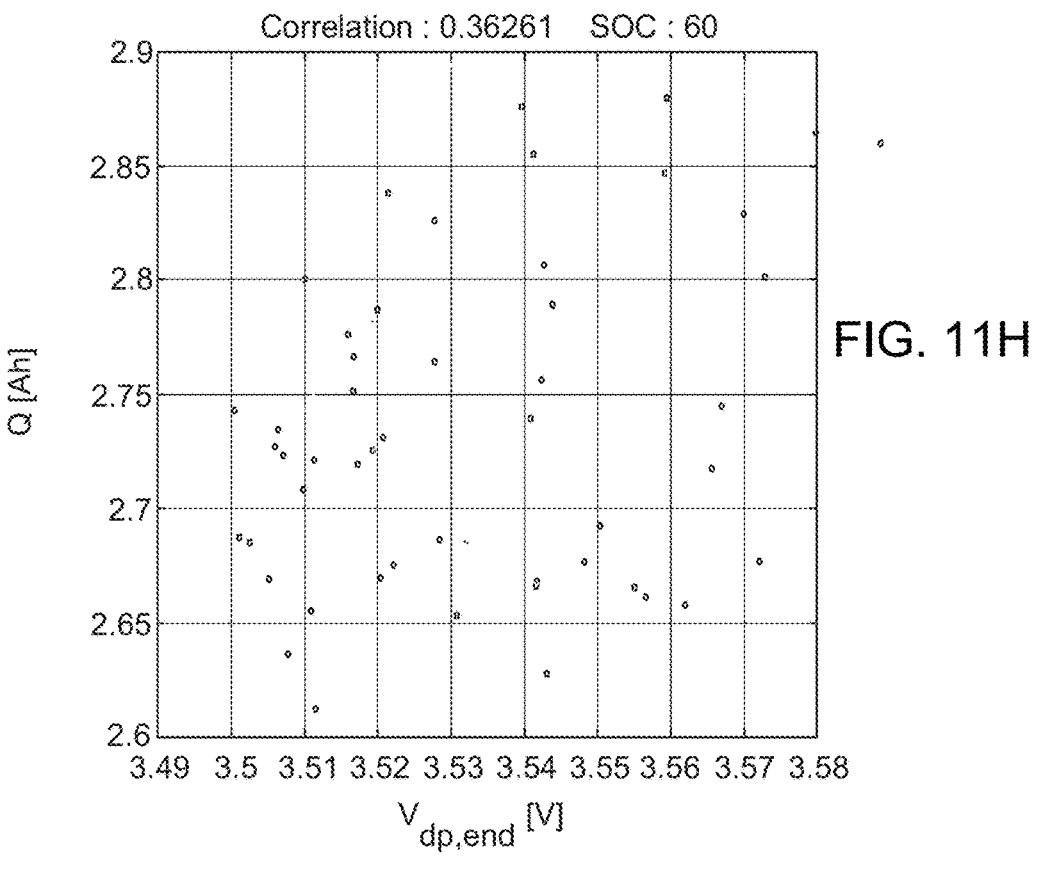
Figure 11I:
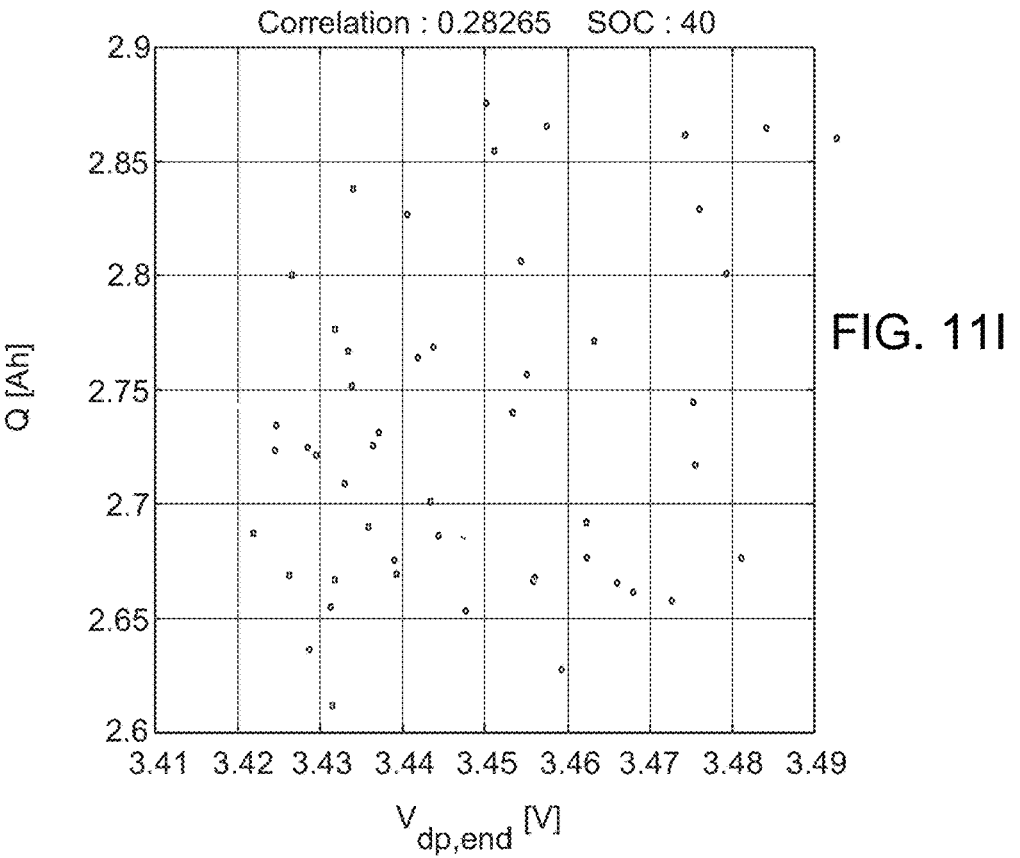
Figure 11J:
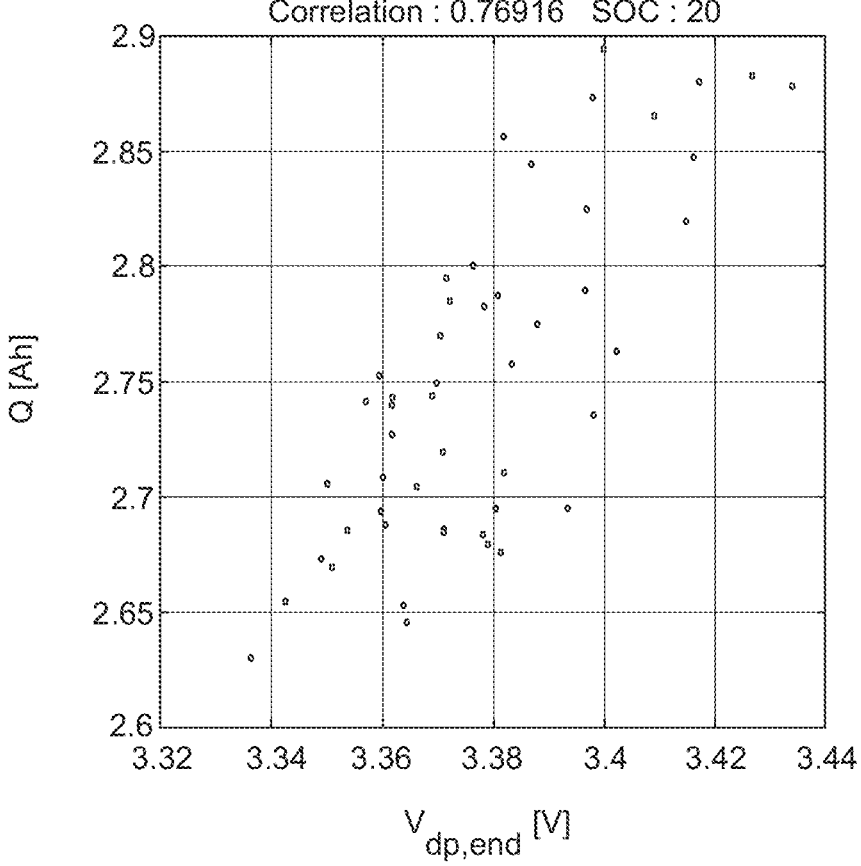
Figures 11K, 11L:
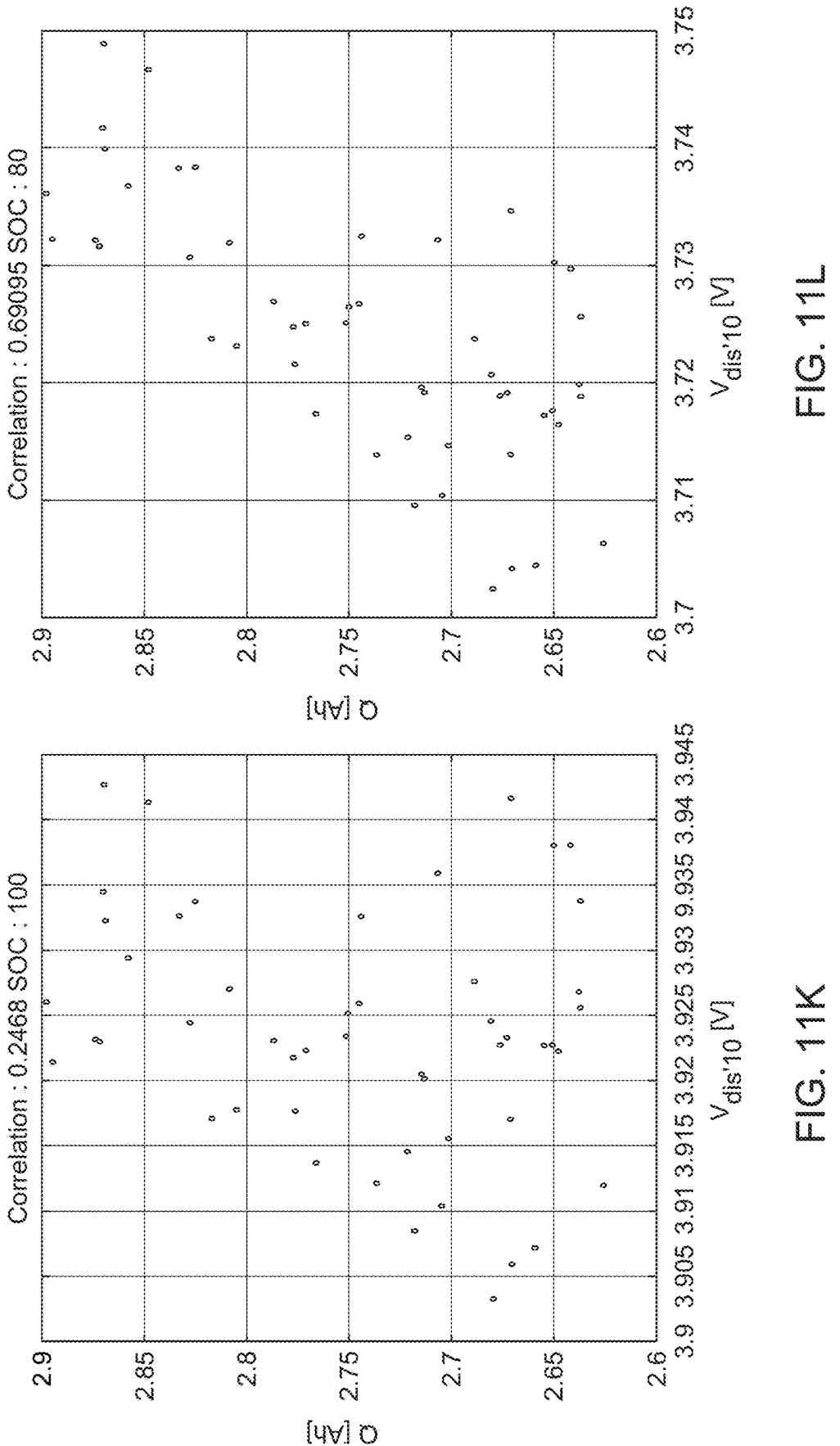
Figures 11M, 11N:
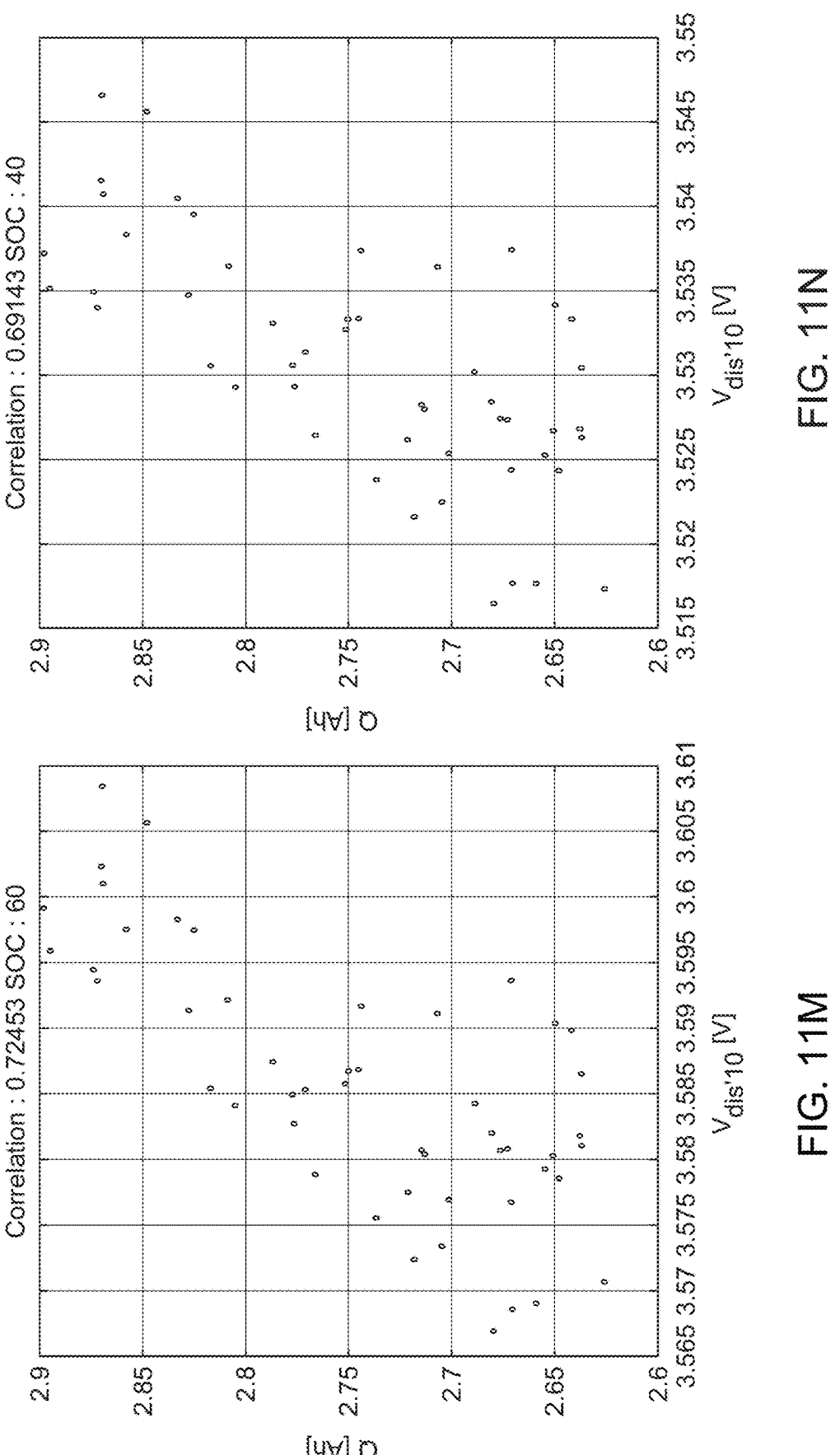
Figure 11O:
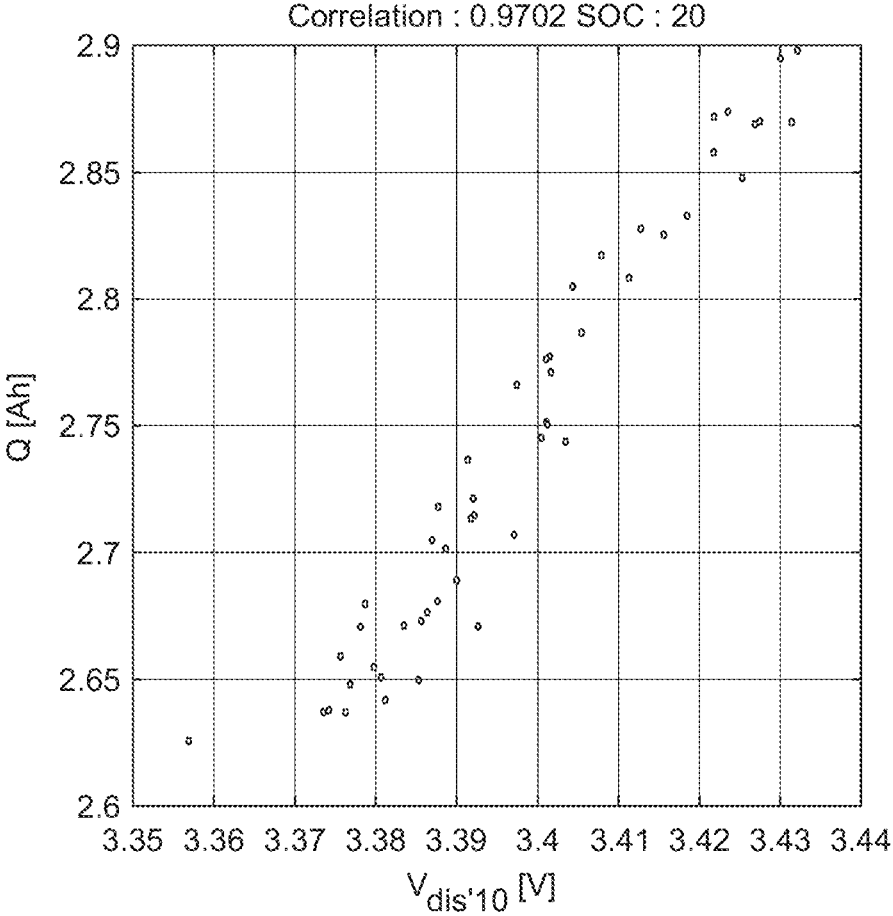
Figure 12A:
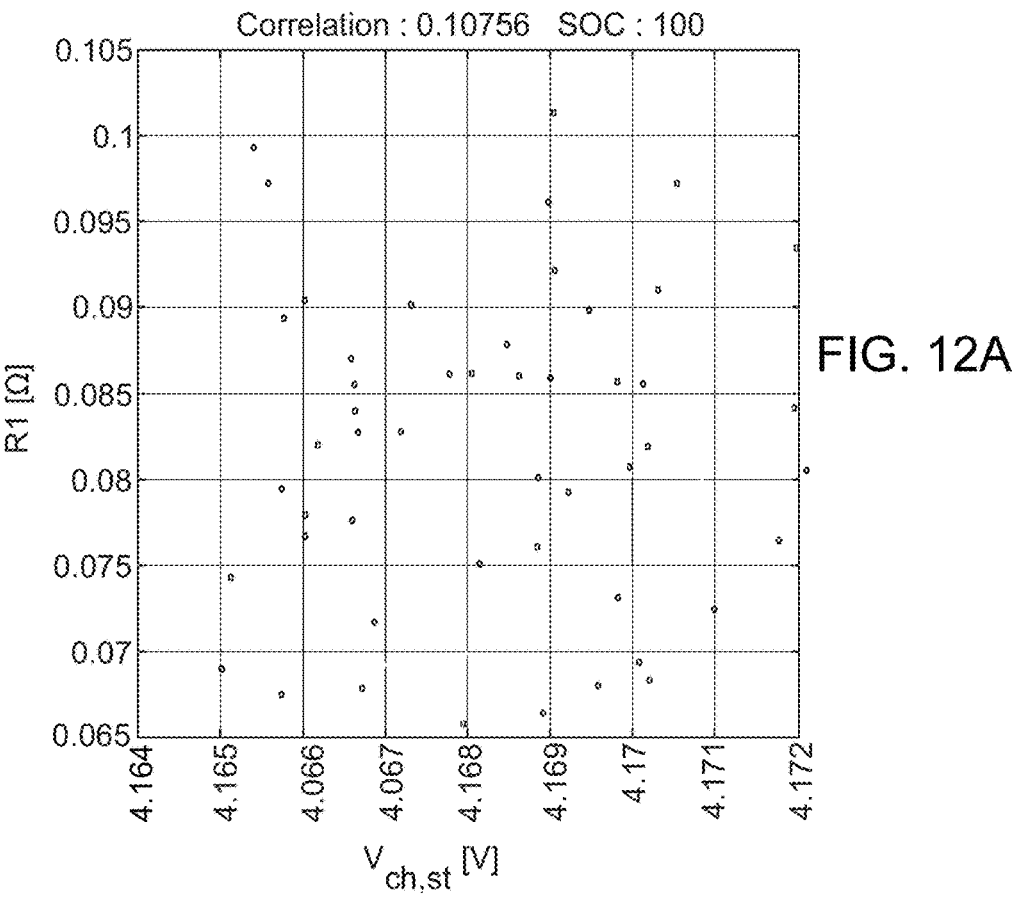
Figure 12B:
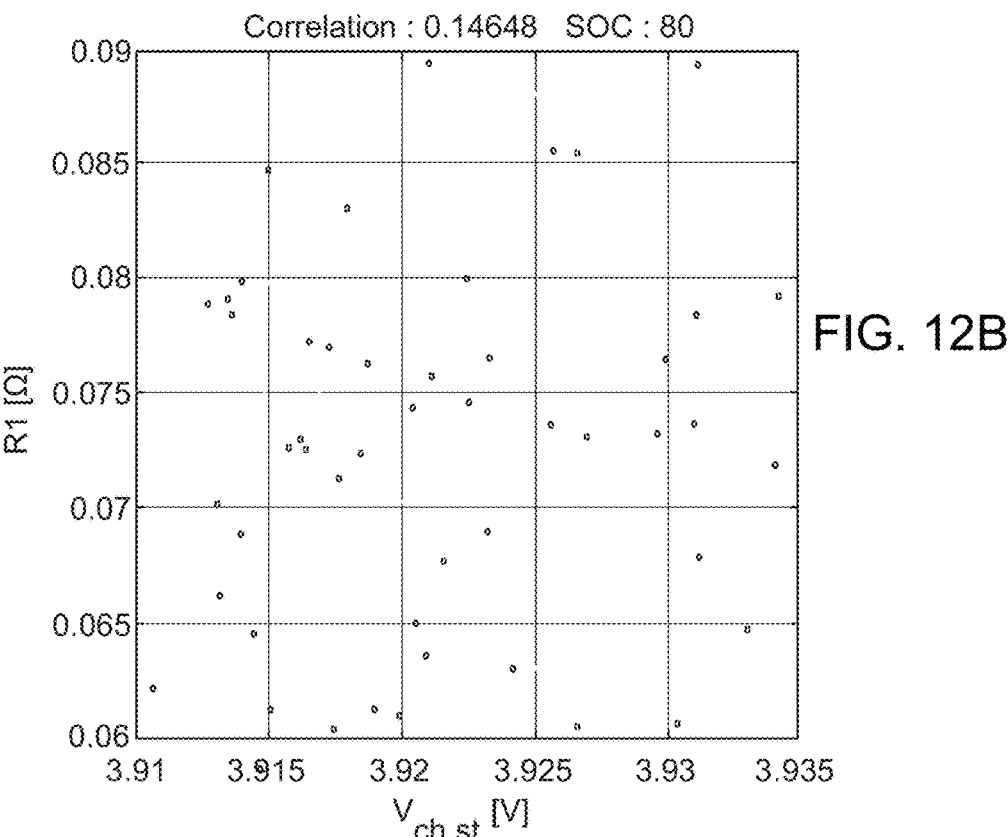
Figure 12C:
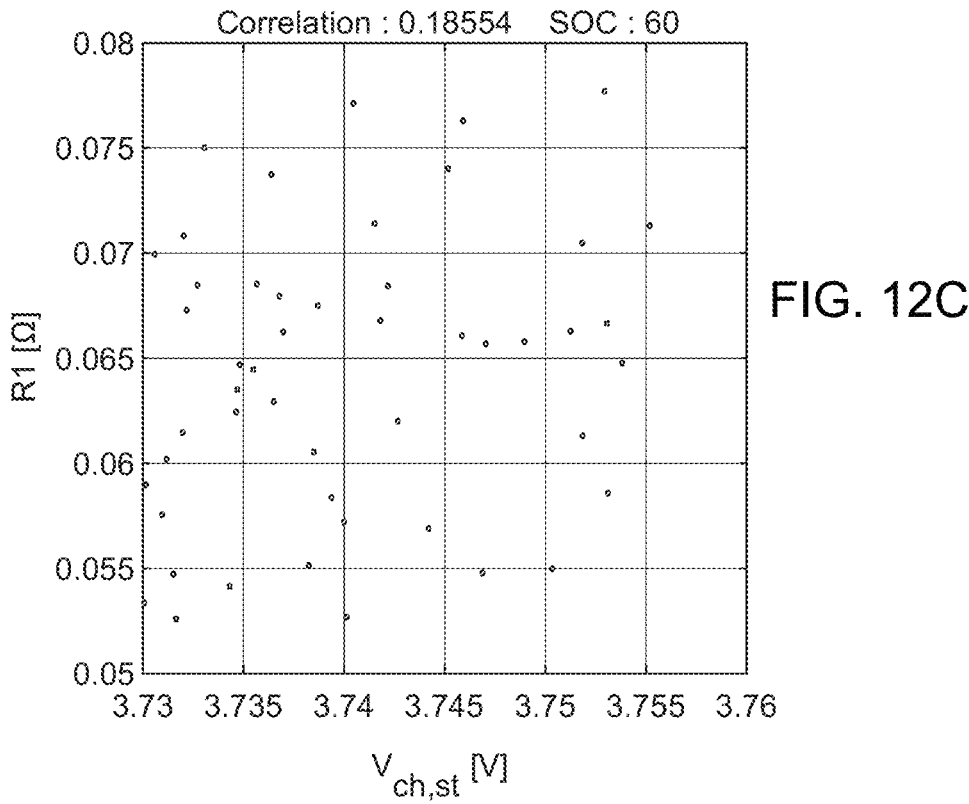
Figure 12D:
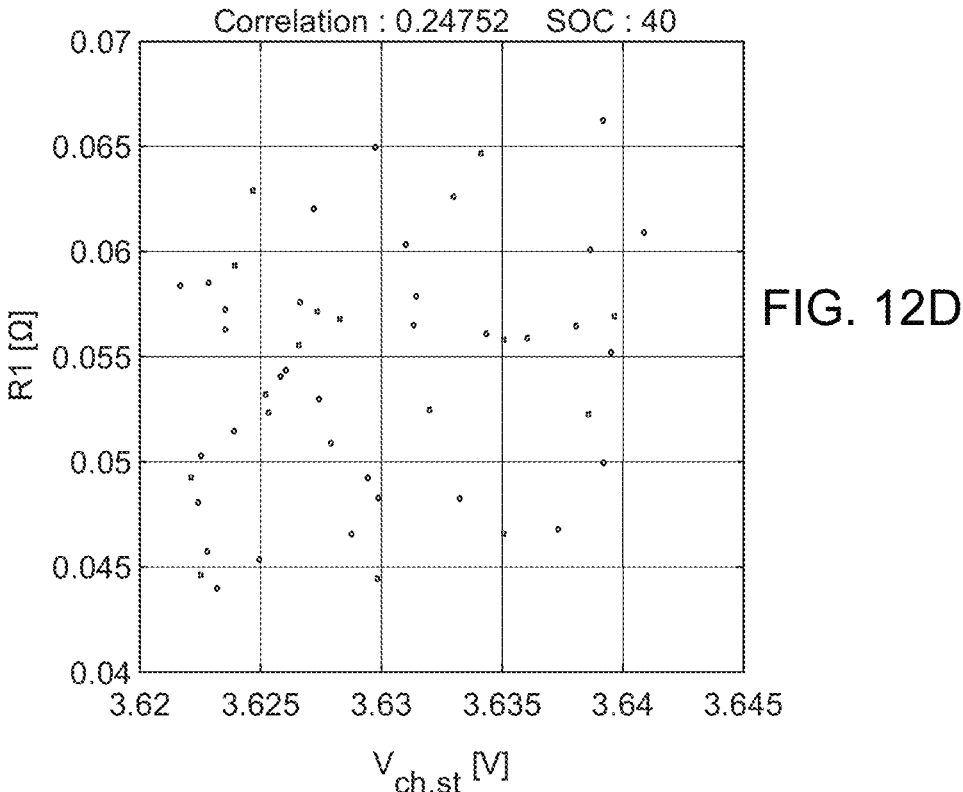
Figure 12E:
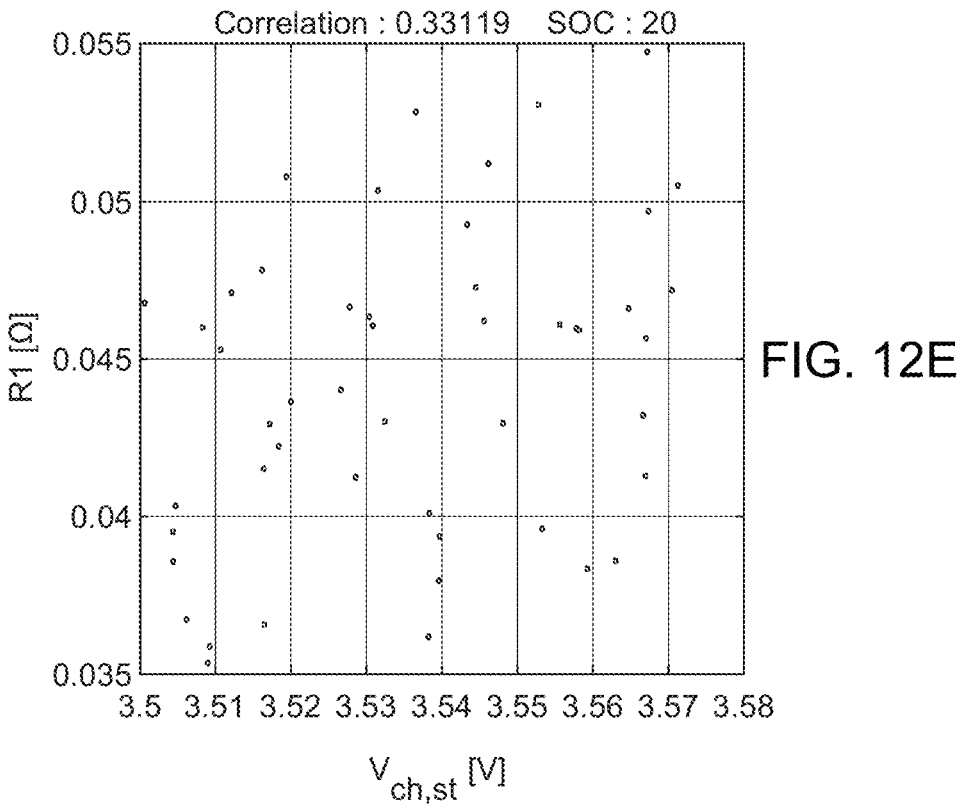
Figure 12F:
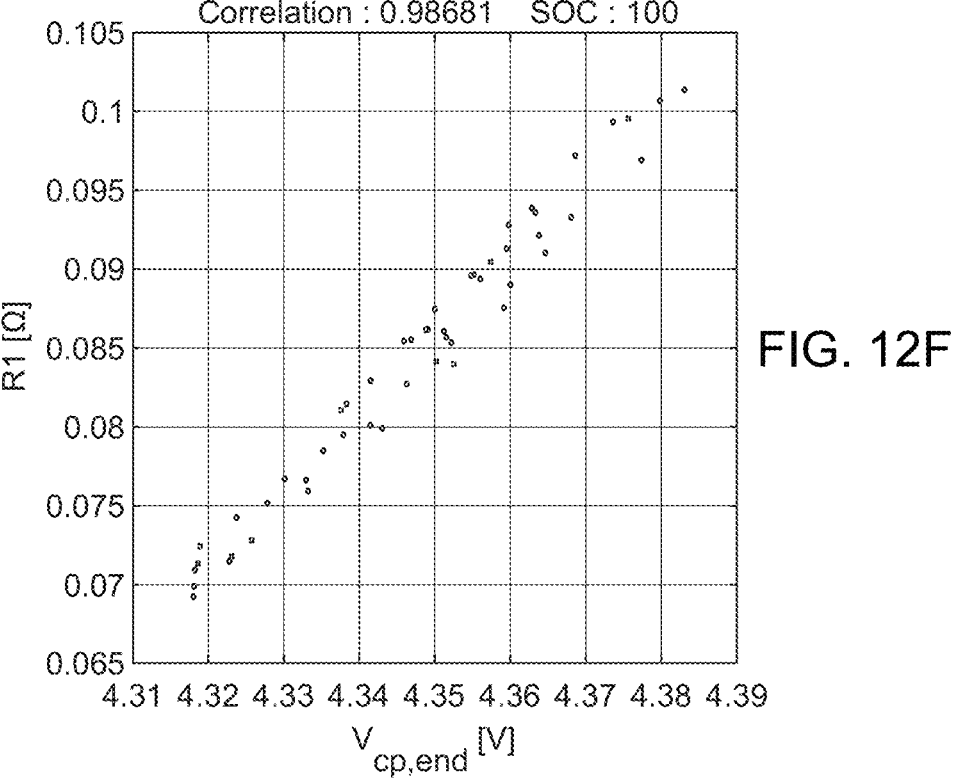
Figure 12G:
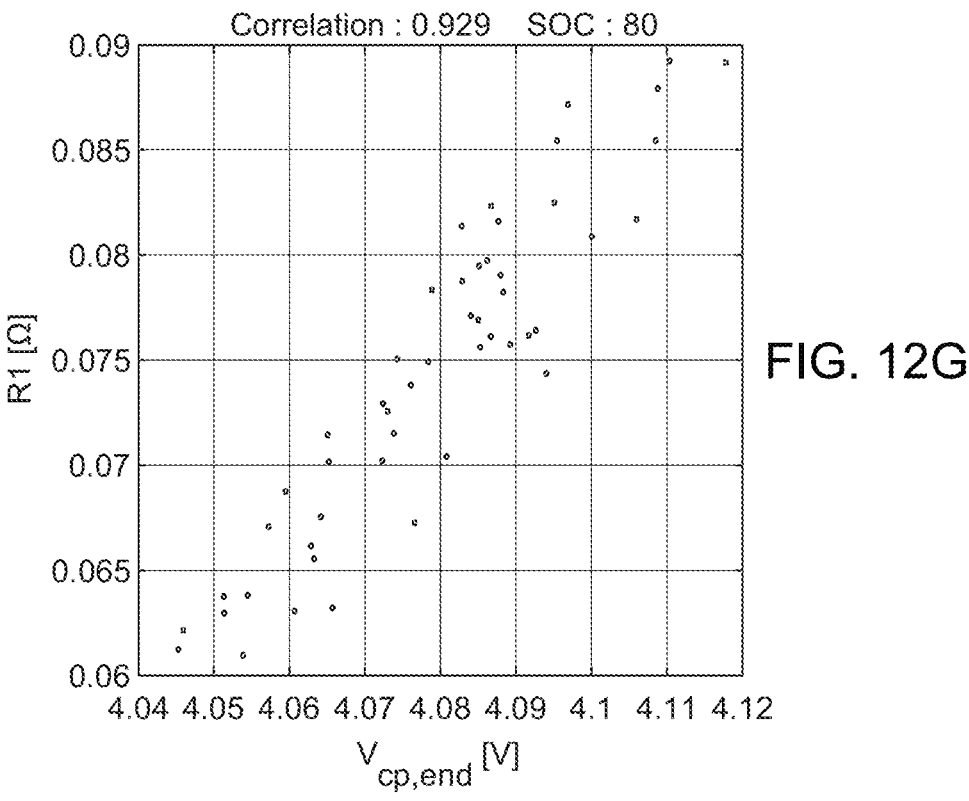
Figure 12H:
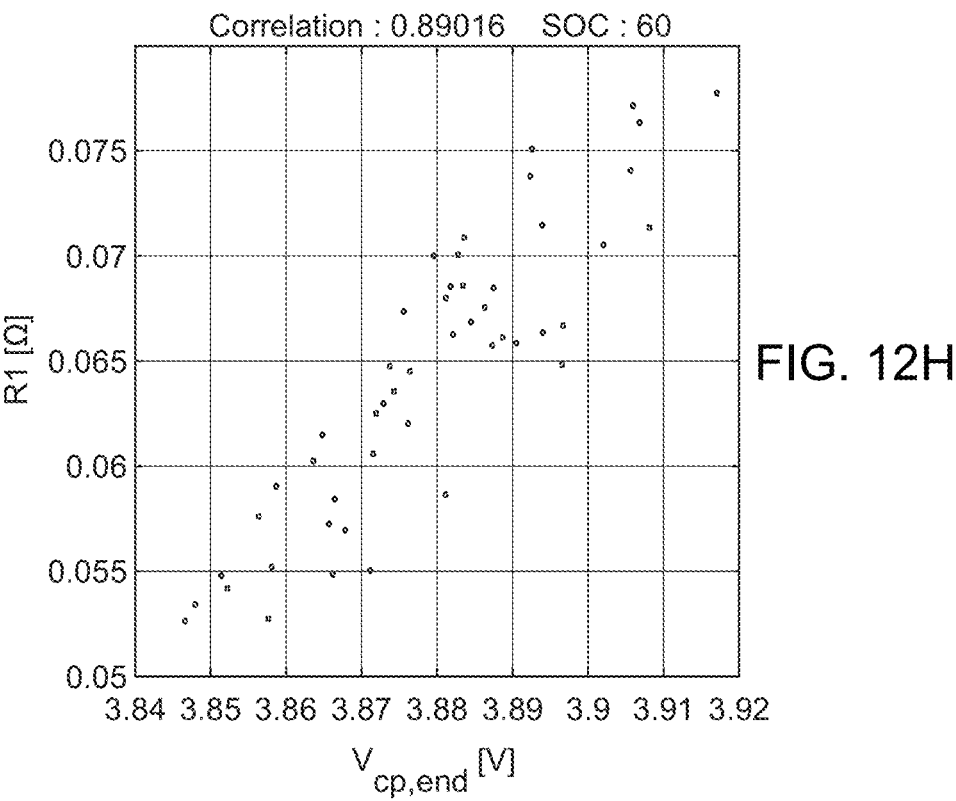
Figure 12I:
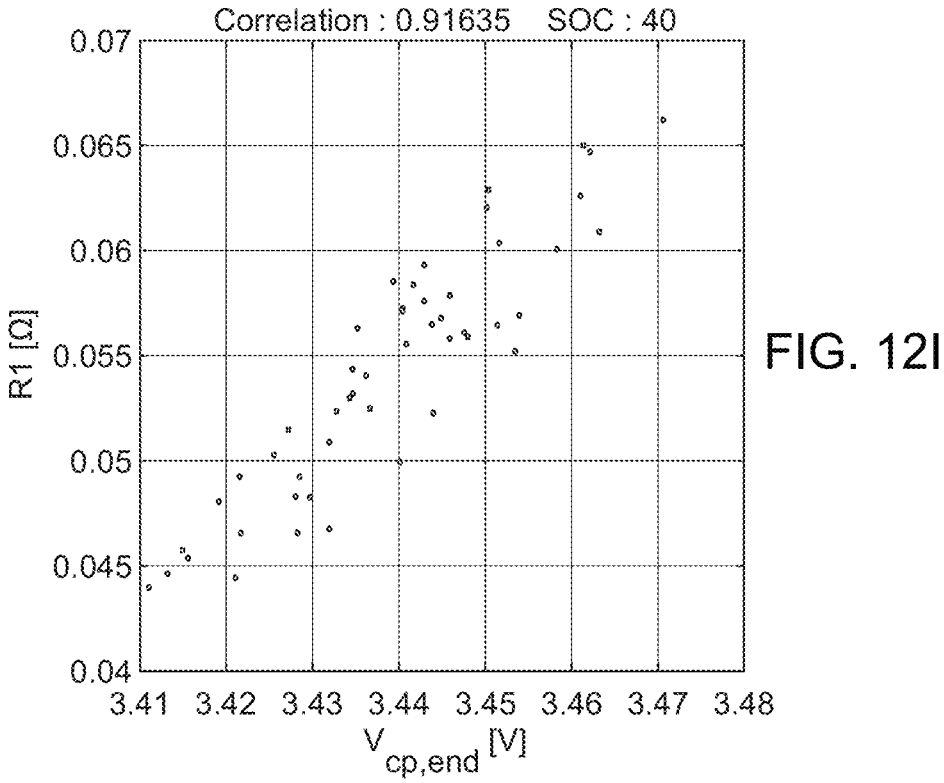
Figure 12J:
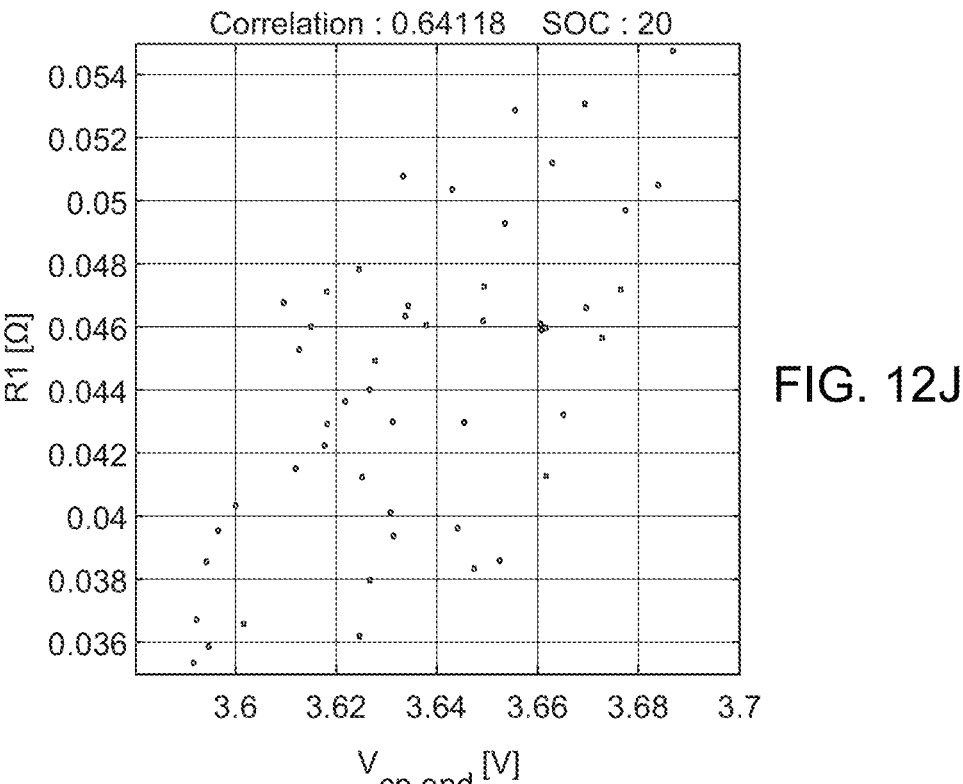
Figure 12K:
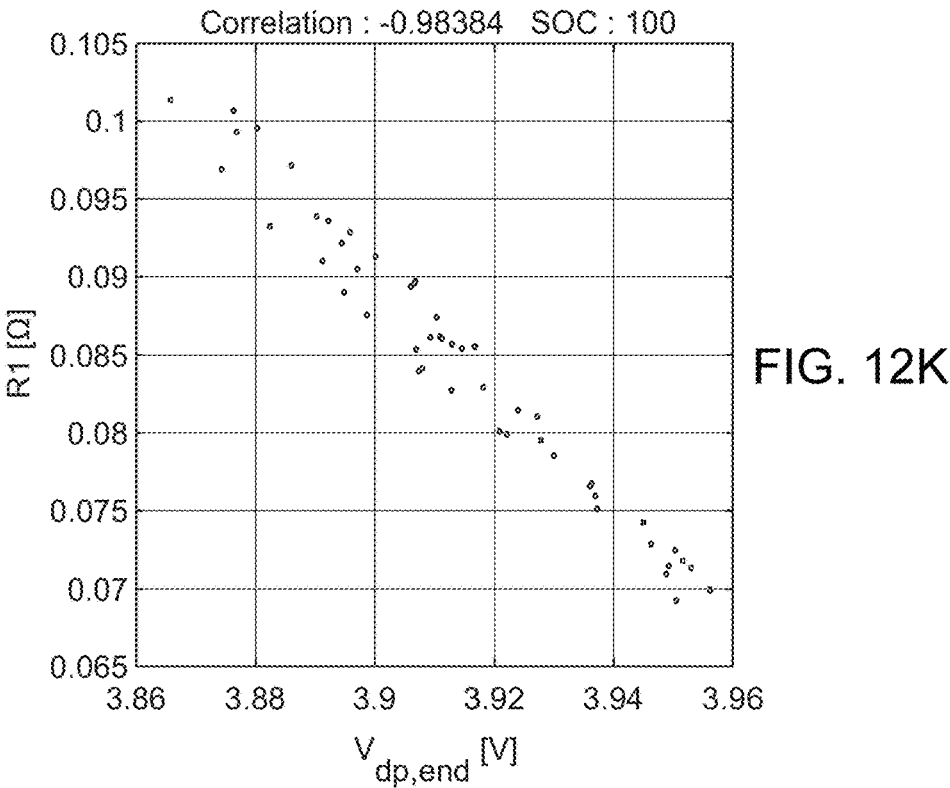
Figure 12L:
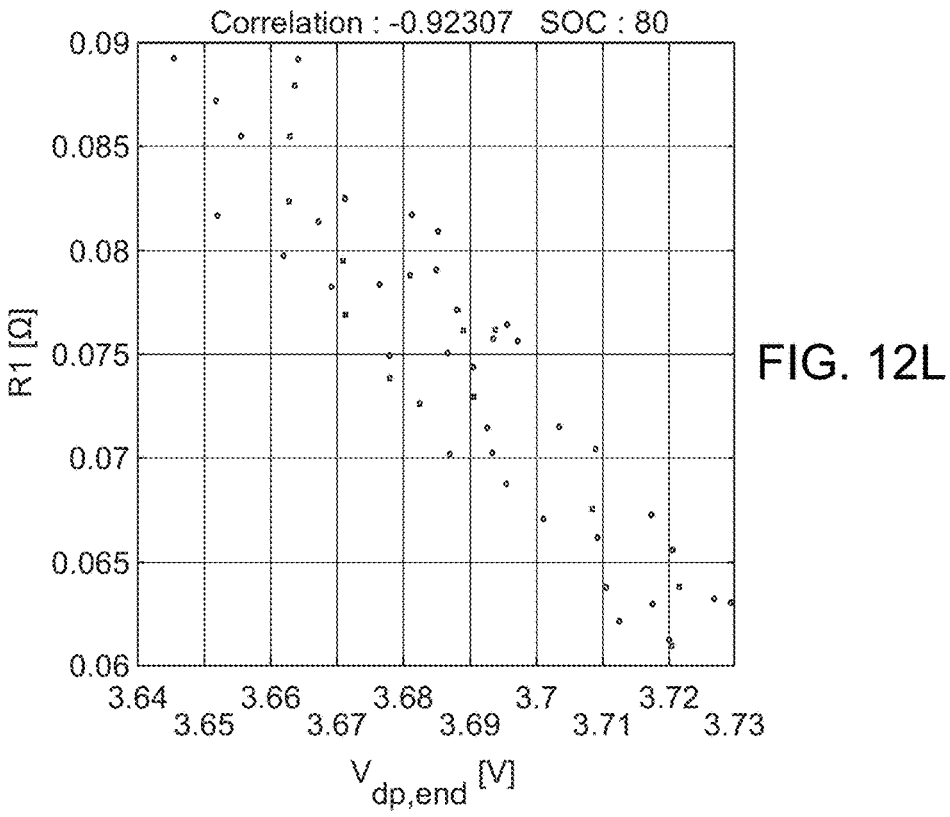
Figure 12M:
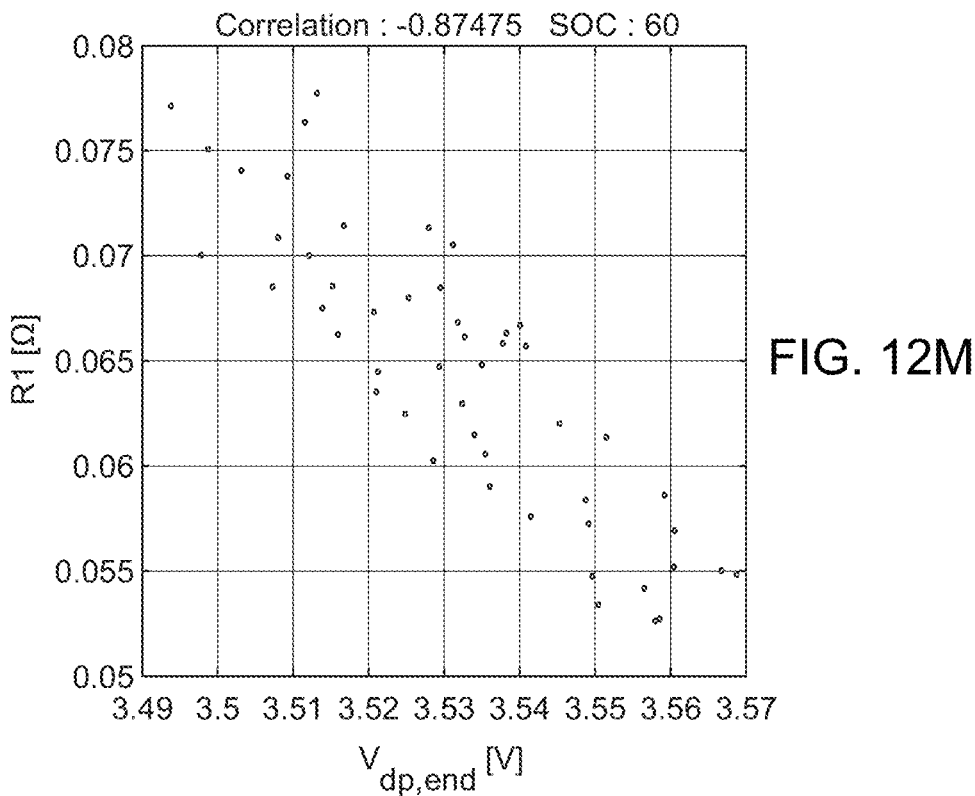
Figure 12N:
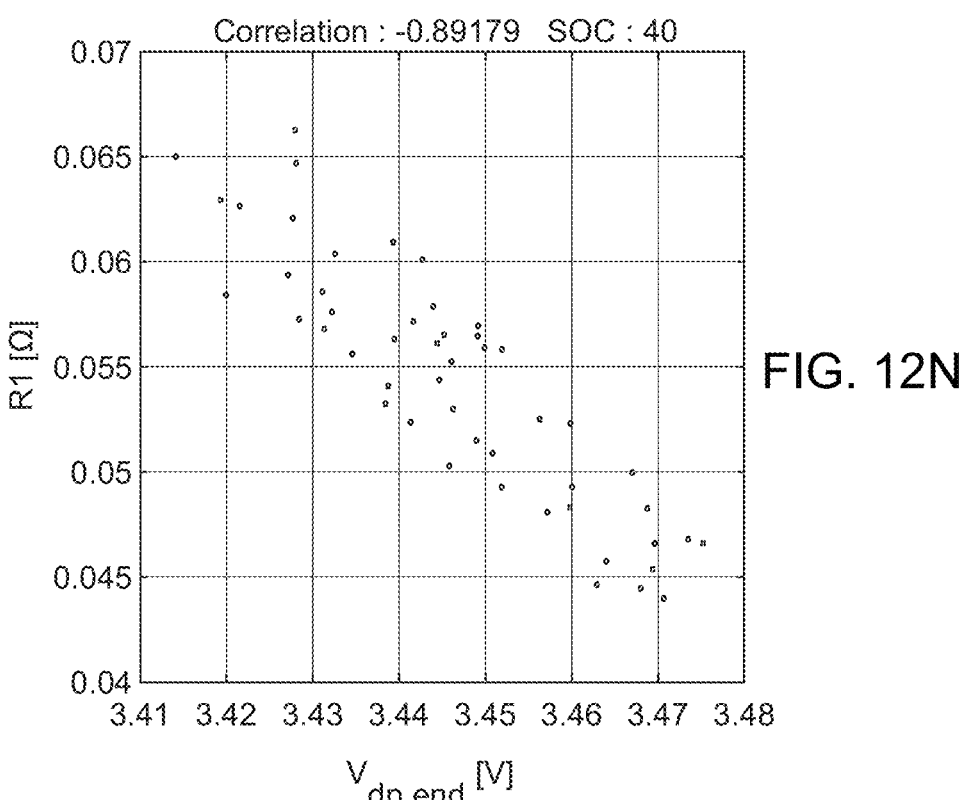
Figure 12O:
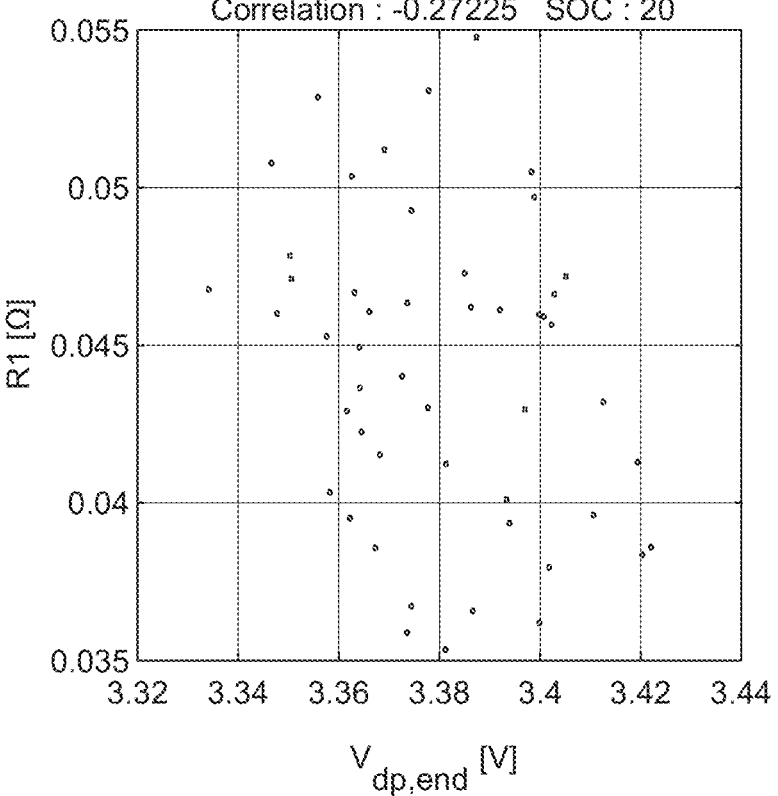

The voltage response to the pulse current of the diagnostic cycle is shown in FIG. 6 and allows for the correlation analysis for all four electrical parameters. FIG. 6 shows the voltage at the start of the discharge pulse $V_{dp,st}$ and the voltage at the end of the pulse $V_{dp,end}$ as well as the voltage at the start of the charge pulse $\Delta V_{cp,st}$ and the voltage at the end of the charge pulse $V_{cp,end}$. Also shown are $V_{dis,10}$, the midpoint of relaxation voltage $V_{dis,mid}$, and the end of relaxation voltage $V_{dis,relax}$.

FIGS. 7A-D show feature analysis based upon the discharge current profile for the 50 cells of the battery at an SoC level of 40, correlating the various parameters with $R_1$. The difference $\Delta V_{dp,st} = V_{dp,st} - V_{dp,end}$ between discharge voltage at the start of the pulse $V_{dp,st}$ and the voltage at the end of the pulse $V_{dp,end}$ gives correlation factors of −0.99 and −0.91 respectively, for $R_1$. Other voltage features, namely the end of charge voltage $-V_{cp,end}$ and end of relaxation voltage $-V_{dis,relax}$ give smaller correlation factors for $R_1$. These features are analyzed at different SoC levels to check the dependence on SoC and the voltage values have high correlation factor at all operating points. FIGS. 8A-8D show the correlation for $\Delta V_{dp,st}$ for $R_1$ at SoC values of 80, 60, 40 and 20. This correlation is consistent over SoC.

A similar two-phase feature analysis can be conducted for the other electrical parameters $R_{2,k}$, $C_k$ and $Q_k$, for $k \in [1,50]$, to obtain voltage features that correspond to representative cells w.r.t. to all 4 electrical parameters. The results for $R_2$ as a function of $V_{dis,mid}$ are shown in FIGS. 9A-E, with lower correlation, and in 9F-9J for $V_{dis,relax} - V_{dis,10}$ with higher correlation. The results for some features of C are shown in FIGS. 10A-10E. The results for some features of Q are shown in FIGS. 11A-11J. Additional feature results for $R_1$ are shown in FIGS. 12A-D. The features with correlation factor $\rho > 0.9$, correspond to ECM parameters ($R_2$, C, Q) are ($V_{dp,end} - V_{dp,st+1}$), $V_{dis,relax}$, ($V_{dp,relax} - V_{dp,end}$) respectively.

The cells with the minimum and maximum values at the identified features are determined to be the representative cells. The diagnostic cycle is run for all cells for battery packs of any size, and then the representative cells are selected based upon the above correlations. These identified features may be used to intelligently poll the representative cells.

Recursive Least Squares Model for Single Cell

Recursive Least Squares (RLS) is used for estimating the parameters of the representative cells. The RLS algorithm estimates electrical parameters of a single cell $R_1$, $R_2$, C and Q for fixed temperature and SoC. The RLS algorithm is divided into two parts: (i) first, formulate the RLS model for estimating $R_1$, $R_2$ and C along with $V_{ocv}$ which is treated as an unknown; and (ii) use the inverted SoC-OCV relationship for formulating another RLS model to estimate cell capacity Q. An RLS model for estimating $R_1$, $R_2$ and C is described in Li et al. See Zhirun Li, Rui Xiong, Hao Mu, He Hongwen, and Chun Wang. A novel parameter and state-of-charge determining method of lithium-ion battery for electric vehicles. Applied Energy, 207, 06 2017, incorporated herein by reference in its entirety. Equations (2) and (3) above are linear in the parameters, since SoC and temperature are fixed.

The RLS algorithm begins by formulating a parametric model, where the Laplace transform is taken, apply a bilinear transform, and then use an inverse Z transform:

$$sV_c(s) = \frac{I_i(s)}{C} - \frac{1}{R_2 C} V_c(s) \tag{4}$$

-continued $$V_k(s) - V_{OCV}(s) = I_L(s)\left(R_1 + \frac{R_2}{1 + R_2Cs}\right) \tag{5}$$

$$s = \frac{2}{T} \cdot \frac{1 + z^{-1}}{1 - z^{-1}} \tag{6}$$

$$V_k(z^{-1}) - V_{OCV}(z^{-1}) = I_i(z^{-1}) \cdot P \tag{7}$$

where, $$P = \frac{\left(\dfrac{R_1T + R_2T + 2R_1R_2C}{T + 2R_2C} + \dfrac{R_1T + R_2T - 2R_1R_2C}{T + 2R_2C}\right)z^{-1}}{\left(1 + \dfrac{T - 2R_2C}{T + 2R_2C}\right)z^{-1}} \tag{8}$$

Using the inverse Z transform, a linear in the parameters output equation is obtained given by:

$$V_t(k)= \tag{9}$$

$$V_{ocv}(k) - \theta_1 V_{ocv}(k-1) + \theta_1 V_t(k-1) + \theta_2 I_L(k) + \theta_3 I_t(k-1) \approx$$
$$(1 - \theta_1)V_{ocv}(k) + \theta_1 V_t(k-1) + \theta_2 I_L(k) + \theta_3 I_L(k-1) \tag{10}$$

An assumption is made to further simplify equations (9) and (10): $V_{ocv}(k-1) \approx V_{ocv}(k)$. Since $V_{ocv}$ is considered to be an unknown parameter, changes in $V_{ocv}$ may be considered negligible to facilitate RLS. This assumption does not significantly the results since the voltage features shown above are based on very short duration charge/discharge pulses that conserve total SoC. Moreover, this assumption allows an estimation of $V_{ocv}$ and does not assume SoC-OCV to be constant over the lifetime of the battery. Table I below gives the forward and inverse transformations from $(R_1, R_2, C) \leftrightarrow (\theta_1, \theta_2, \theta_3)$.

TABLE I

PARAMETER TRANSFORMATIONS

| $(R_1, R_2, C) \rightarrow (\theta_1, \theta_2, \theta_3)$ | $(\theta_1, \theta_2, \theta_3) \rightarrow (R_1, R_2, C)$ |
|---|---|
| $\theta_1 = -\dfrac{1 - 2R_2C}{1 + 2R2_C}$ | $R_1 = \dfrac{\theta_3 - \theta_2}{1 + \theta_1}$ |
| $\theta_2 = -\dfrac{R_1 + R_2 + 2R_1R_2C}{1 + 2R_2C}$ | $R_2 = \dfrac{2(\theta_3 + \theta_1\theta_2)}{\theta_1^2 - 1}$ |
| $\theta_3 = -\dfrac{R_1 + R_2 - 2R_1R_2C}{1 + 2R_2C}$ | $C = \dfrac{-1}{4}\dfrac{(\theta_1 + 1)^2}{\theta_3 + \theta_1\theta_2}$ |

Finally, the RLS model is of the form:

$$y(t) = \vartheta^T \phi(t) \tag{11}$$

where the regressor $\phi$ and parameters $\vartheta$ are given by $$\phi = [1, V_t(k-1), I(k), I(k-1)] \tag{12}$$

$$\vartheta = [(1-\theta_1)V_{oc}(k), \theta_1, \theta_2, \theta_3] \tag{13}$$

A recursive least square optimization with forgetting factor is used to estimate $\vartheta$ directly from equation (11). The parameters $\theta_1$, $\theta_2$, and $\theta_3$ are identified using:

$$y(k) = \phi(k)\vartheta(k) \tag{14}$$

$$K(k) = \frac{P(k-1)\phi(k)^T}{\phi(k)P(k-1)\phi(k)^T + \lambda} \tag{15}$$

-continued $$\hat{\vartheta}(k) = \hat{\vartheta}(k-1) + K(k)[z(k) - \phi(k)\hat{\vartheta}(k-1)] \tag{16}$$

$$P(k) = \frac{I - K(k)\phi(k)]P(k-1)}{\lambda} \tag{17}$$

where $\hat{\vartheta}(k)$ is the estimate of parameters $\vartheta_k$ in equation (13), P(k) is the covariance matrix, K(k) is the gain and $\lambda \in [0,1]$ is the forgetting factor.

Finally, using a similar approach but in continuous time, an RLS model is formulated for estimating the cell capacity Q by first taking the Laplace of equation (1) to derive the transfer function from I(t) to $\xi$(t)

$$s \cdot \xi(s) = \frac{-1}{Q}I(s) \tag{18}$$

There is a linear in the parameter system. However it involves a derivative of a measured signal. Therefore a first order filter is applied to both sides of equation (18):

$$\frac{1}{\Lambda(s)} = \frac{\lambda}{s + \lambda}, \tag{19}$$

which leads to $$\underbrace{\left\{\frac{s\lambda}{s + \lambda}\right\}Z(s)}_{=\zeta(s)} = \frac{-1}{Q}\underbrace{\left\{\frac{\lambda}{s + \lambda}\right\}I(s)}_{=\rho(s)} \tag{20}$$

where a linear in the parameter form is obtained using the inverse Laplace transform given by equation (21) with estimation parameter $\theta = -1/Q$.

$$\xi(t) = \theta^T\rho(t) \tag{21}$$

Finally, Q is estimated using RLS with forgetting factor as defined in (14)-(17) where $\hat{\vartheta}_k$ is the estimate of $\theta$ which is $$\frac{-1}{Q}$$

in this step.

The electrical model defined by equations (1)-(3) is converted from time domain to frequency domain using Laplace transformation, followed by a z-transform and Tustin transformation as defined by Eq.(11)-(14). Finally, the resulting model is reformatted in linear in the parameter form with $\phi$, $\theta_1$, $\theta_2$, and $\theta_3$ being the parameters. Using the diagnostic cycle response (current and voltage response as shown in FIG. 5) as input, the parameters $\phi$, $\theta_1$, $\theta_2$, and $\theta_3$ are recursively estimated by minimizing the linear least squared cost function. The estimated $\phi$, $\theta_1$, $\theta_2$, and $\theta_3$ are then used to get estimated $R_1$, $R_2$ and C using conversion from Table 1. The process is repeated for the representative cells at three operating points (inducing points from sGPR).

Sparse Gaussian Process Regression

GPR is a powerful tool for non-parametric regression in high-dimensional spaces. One of the appealing features of GPR is that it provides uncertainty bounds around the estimates. A GPR is fully described by its mean and covariance, where the outputs of the modeled function are jointly distributed. See Geoffrey E. Hinton and Carl E. Rasmussen.

Evaluation of Gaussian processes and other methods for non-linear regression. 1997, incorporated herein by reference in its entirety. In essence, GPR a priori describes the behavior of the function values using the following assumptions $$y_i = f(x_i) + \varepsilon \tag{22}$$

where $y_i$ and $x_i$ are the scalar output and vector input $x_i \in \mathbb{R}^D$, and $\varepsilon$ is drawn from $N(0, \sigma^2)$. Then the joint distribution is given by $$p(y|X) = N(0, K(X,X) + \sigma^2 I) \tag{23}$$

where covariance matrix K is called the Kernel matrix. The joint posterior, given the Bayesian inference, can be defined as $$p(f, f^* | y) = \frac{p(y | f) p(f, f^*)}{p(y)} \tag{24}$$

$$p(f^* | y) = \int \frac{p(y | f) p(f, f^*)}{p(y)} df \tag{25}$$

See Qi Wu, Rob Law, and Xin Xu. "A sparse Gaussian process regression model for tourism demand forecasting in Hong Kong." *Expert Syst. Appl.*, 39:4769-4774, 04 2012, incorporated herein by reference in its entirety. By marginalizing the latent variables, the joint prior distribution and independent likelihood probability are given by $$p(f, f^*) = N\left(0, \begin{bmatrix} K_{f,f^*} & K_{f^*,f} \\ K_{f,f^*} & K_{f^*,f^*} \end{bmatrix}\right) \tag{26}$$

$$p(y | f) = N(f, \sigma^2 I) \tag{27}$$

Here, f and f* are variables for the covariance calculation and I is the identity matrix. Finally, a closed form can be obtained for the GP predictive distribution by evaluating the integral in equation (25) to get $$p(f^* | y) = N(\mu, \Sigma) \tag{28}$$

Here $\mu$ is the predicted output mean and $\Sigma$ is the variance. In order to reduce the computational burden and large data demand of GPR, sparse GPR is used with the inducing variables approach from Titsias et. al. See Michalis K. Titsias. Variational learning of inducing variables in sparse Gaussian processes, In *AISTATS*, 2009, incorporated herein by reference in its entirety. Using this approach m inducing variables can be chosen which are latent functions evaluated at some $X_m$ inputs. These inputs $X_m$ can then be identified as variational parameters by minimizing the distance between the exact posterior GP given by equation (28) and a variational approximation. In the method, 3 inducing points ($\xi$) are used for a fixed $\Gamma$, for example. Other numbers of inducing points may be used.

In the method according to the invention, the Recursive Least Square (RLS) algorithm is used as described above in equations (4)-(10) in discrete time to estimate parameters $R_1$, $R_2$ and C for the Representative Cells at one of the operating points referred to as the inducing point in sGPR algorithm. This process is repeated for all the other inducing points 'n' for a total of 3 times (in this example n=3). The operating point (SoC,Temp) at which this estimation is performed is obtained from the training of sGPR algorithm. The operating points, referred earlier as inducing points, is a set of three different operating points at which RLS estimation is performed since n=3. Since battery capacity Q [Ah] is not a function of SoC and Temperature, it is only estimated once for each Representative Cell.

EXAMPLE

The SoH pipeline according to the invention is validated using numerical experiments on a pack of 6 Li-NMC cells connected in series, modeled using ECM and equations (1)-(3). The state-dependent electrical parameters used are obtained using experimental data on a beginning-of-life Li-NMC cell, as seen in FIG. 2. The method shown in FIG. 4 is used to estimate bounds on the electrical parameters of representative cells, as a function of SoC and temperature given a fixed charge-discharge pulse diagnostic cycle applied to the battery pack.

The battery pack of 6 cells connected in series has electrical parameters, $R_1$, $R_2$, C and Q which are uniformly perturbed between 5-7% from the fresh cell to induce heterogeneity in the battery pack. Output voltage measurement were obtained at 9 distinct operating points ($\{\xi \in \{30\%, 50\%, 80\%\} \times \{\Gamma \in \{20° C., 30° C., 40° C.\}\}$) and used to intelligently poll the index of representative cells w.r.t. each electrical parameter using the pulse profile shown in FIG. 5 and the parameters shown in FIG. 6, for the respective operating points. The electrical parameters of the representative cells are estimated using the RLS algorithm described above. Finally, the estimated parameters are used to predict the parametric space as a function of SoC and temperature using sparse GPR as described above, for all the operating points.

Figure 13:
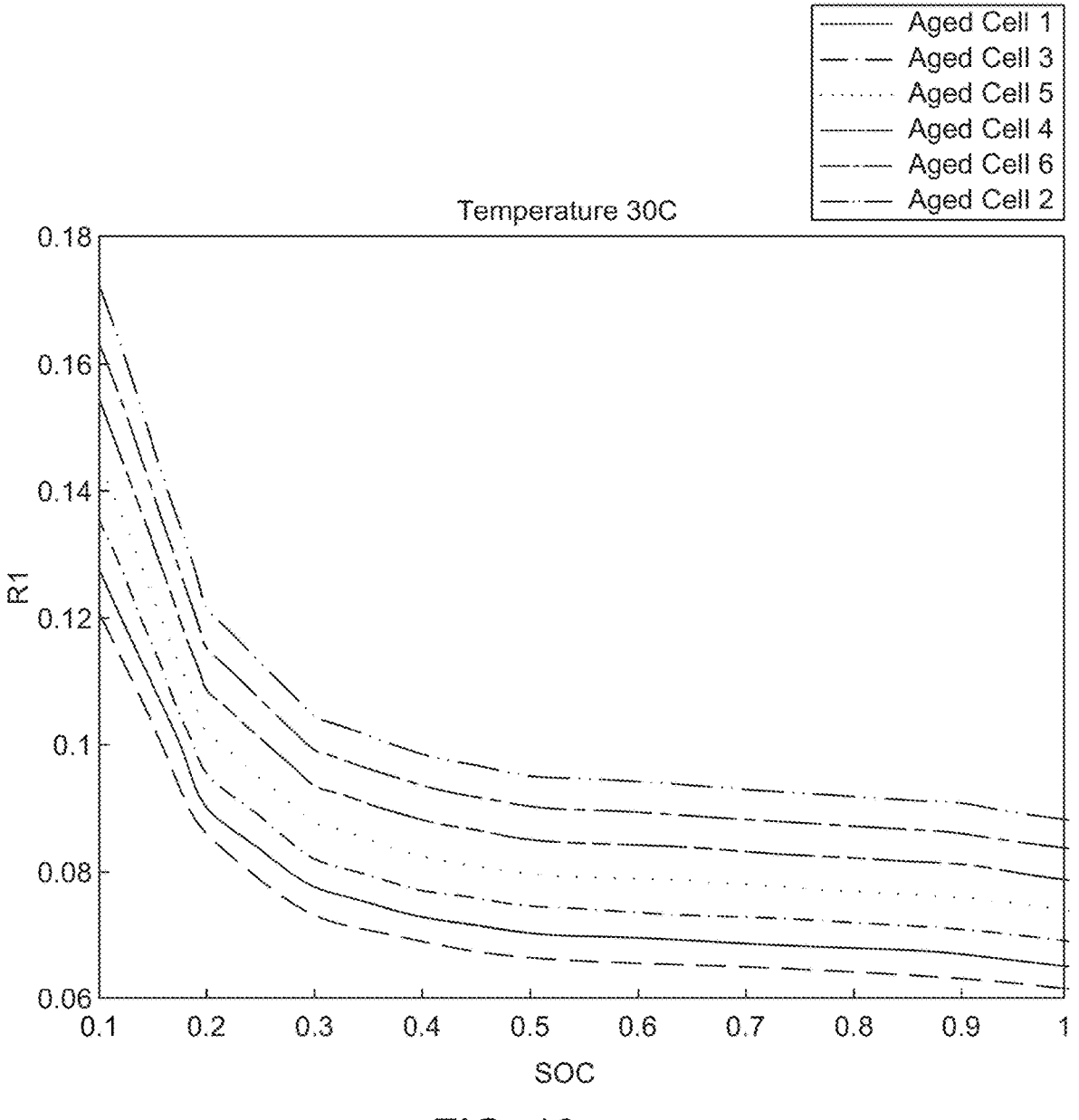
FIG. 13 is a graph illustrating the heterogeneity induced by uniformly perturbing the nominal $R_1$ parameter shown in dashed line of the ECM model as a f($\xi$) at 30° C. for 6 cells in series as well as $R_1$ values for all temperatures in the operating range.
Figure 14:
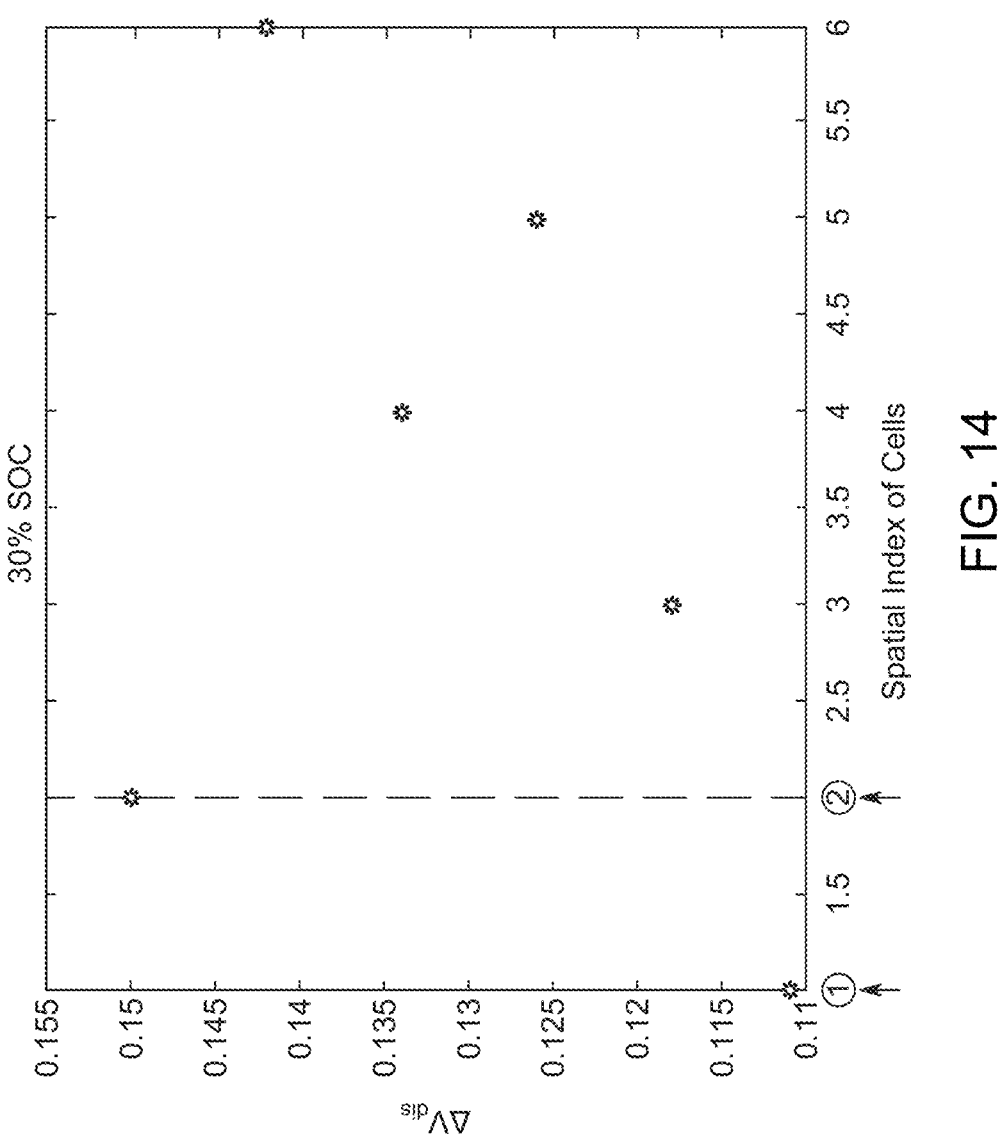
FIG. 14 is a graph illustrating intelligent polling validation showing the cell position as a function of $\Delta$Vdis.

In this example, the parameter $R_1$ is considered which is a function of ($\xi$, $\Gamma$). FIG. 13 shows the uniformly perturbed values of $R_1$ in a pack of 6 cells. It should be noted that FIG. 13 also illustrates the lack of correlation between spatial proximity of the cells in a pack and parameter values of the cells in the pack. As can be seen in FIG. 14, cell index 1 and 2 have the lowest and highest feature $\Delta V_{dis} = V_{dp,st} - V_{dp,end}$ values, respectively, and hence are identified as representative cells for the entire pack for parameter $R_1$. Since features including $R_1$ are invariant w.r.t. $\xi$, the representative cells w.r.t. to $R_1$ for other operating points remains fixed.

Figure 15:
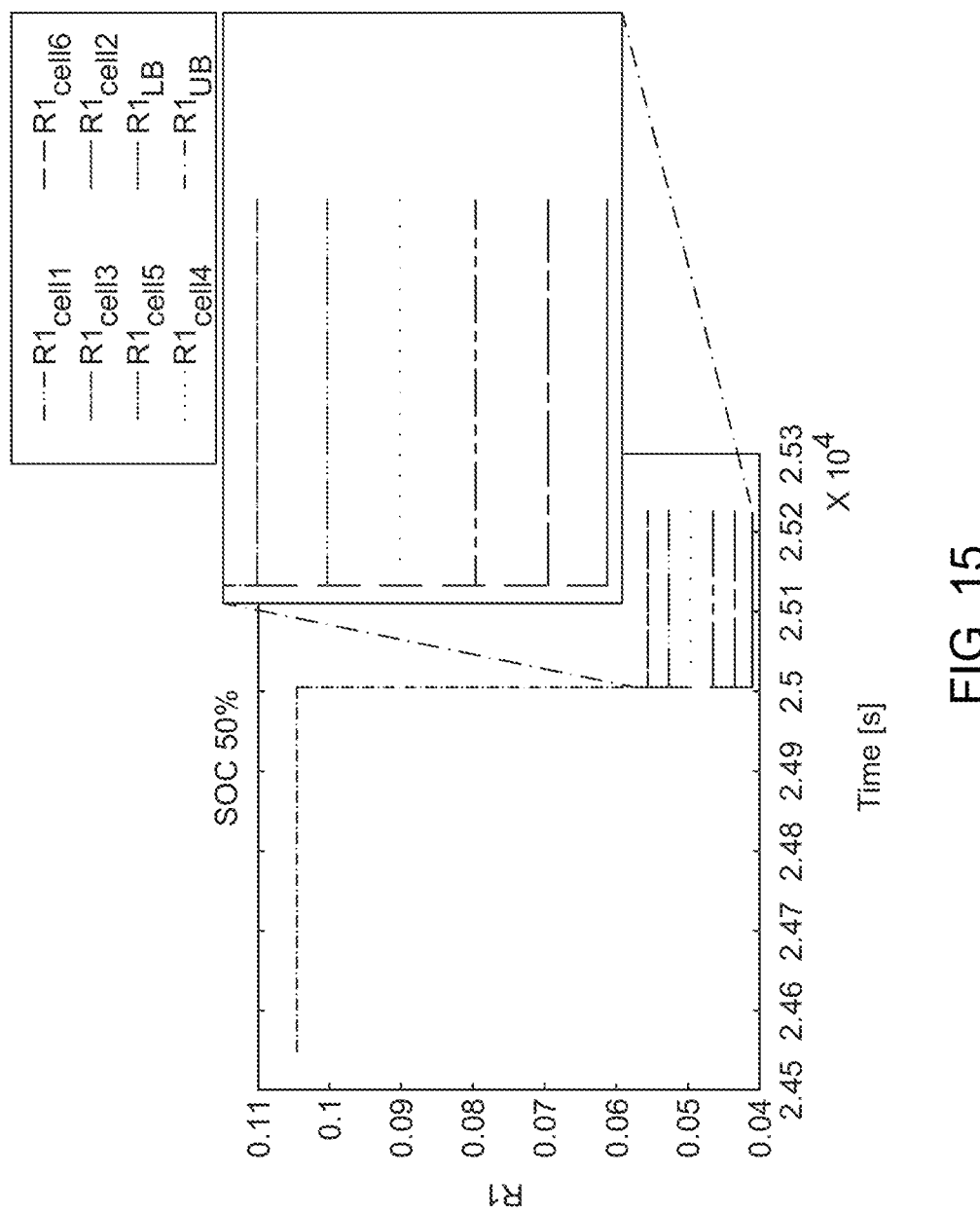
FIG. 15 illustrates the recursive least squares estimates of $R_1$ for the representative cells, indexed 1 and 2.

FIG. 15 shows the estimation of $R_1$ for representative cell index 1 and 2 along with the measured values for cells 1-6 using RLS. The upper dashed line is the estimation for cell index 2 and the lower dashed line is the estimation for cell index 1. Both of the estimations converge to the true value with high accuracy (RMSE=0.002$\Omega$). More importantly, this also verifies that the estimated upper bound and lower bound encloses all the other parameter values for all other cells in the pack.

Figure 16:
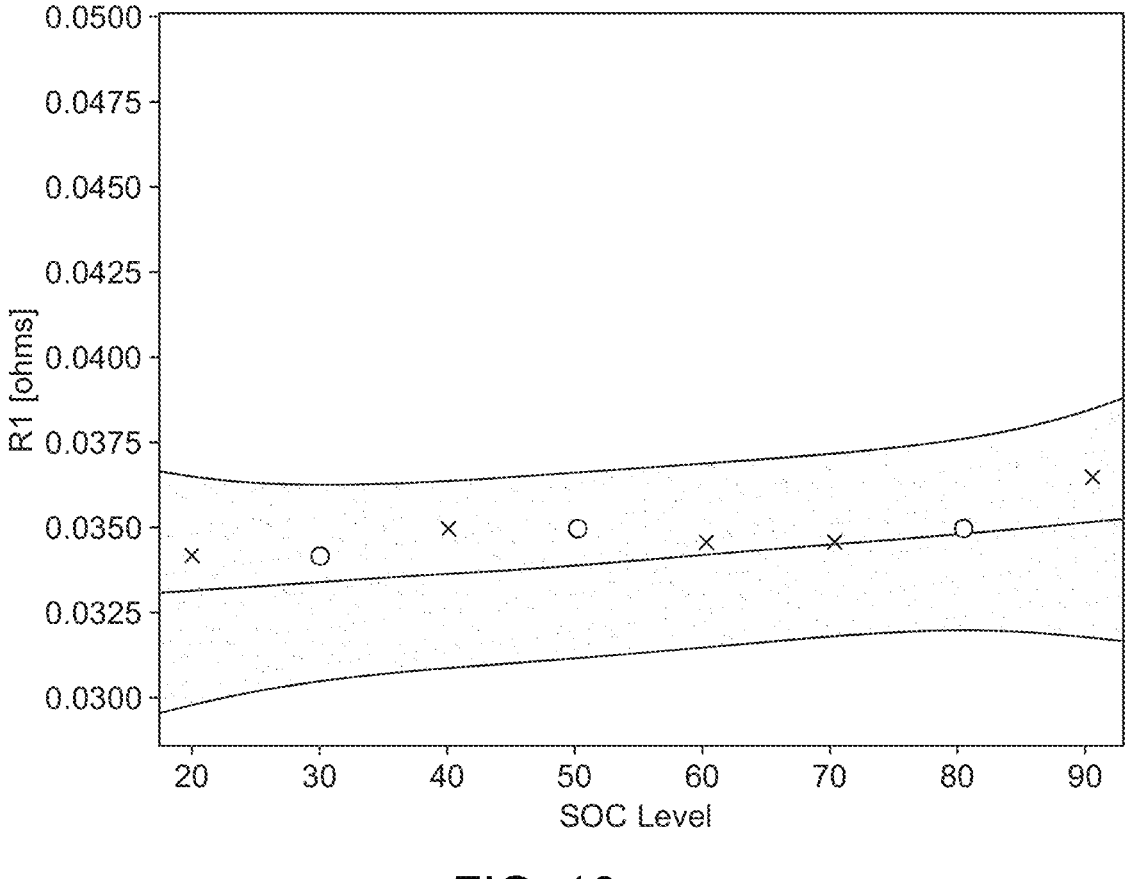
FIG. 16 is a graph illustrating sGPR results of estimated $R_1$=f($\xi$,$\Gamma$) at temperature $\Gamma$=20° C.

Finally, FIG. 16 shows the cross-section of estimated parametric surface of $R_1 = f(\xi, \Gamma)$ for $\Gamma = 20° C.$, using sGPR. The solid curve represents the mean prediction of $R_1$ at $\Gamma = 20° C.$, whereas the shaded region shows the ±95% confidence interval around the estimates. The circles are sampled data and the crosses are true values of $R_1$ at un-sampled points. These results confirms that the estimates of the parameter at selected operating points, in this case $\xi \in \{30\%, 50\%, 80\%\}$, can be used to predict values at other operating points $\xi \in [20° C., 90° C.]$, with uncertainty bounds around the estimates.

Figure 17:
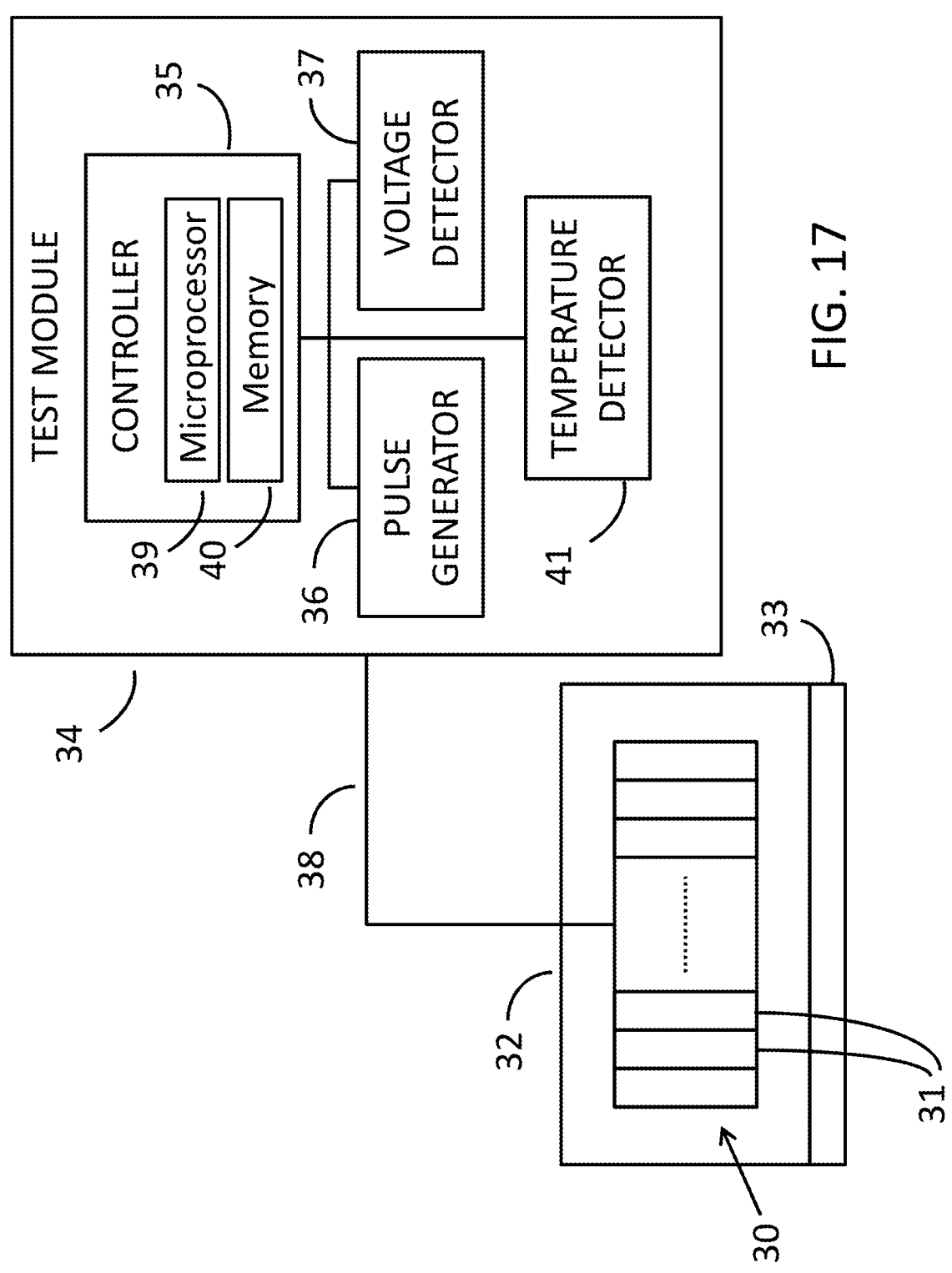
FIG. 17 is a schematic diagram of a first embodiment of the system according to the invention.
Figure 18:
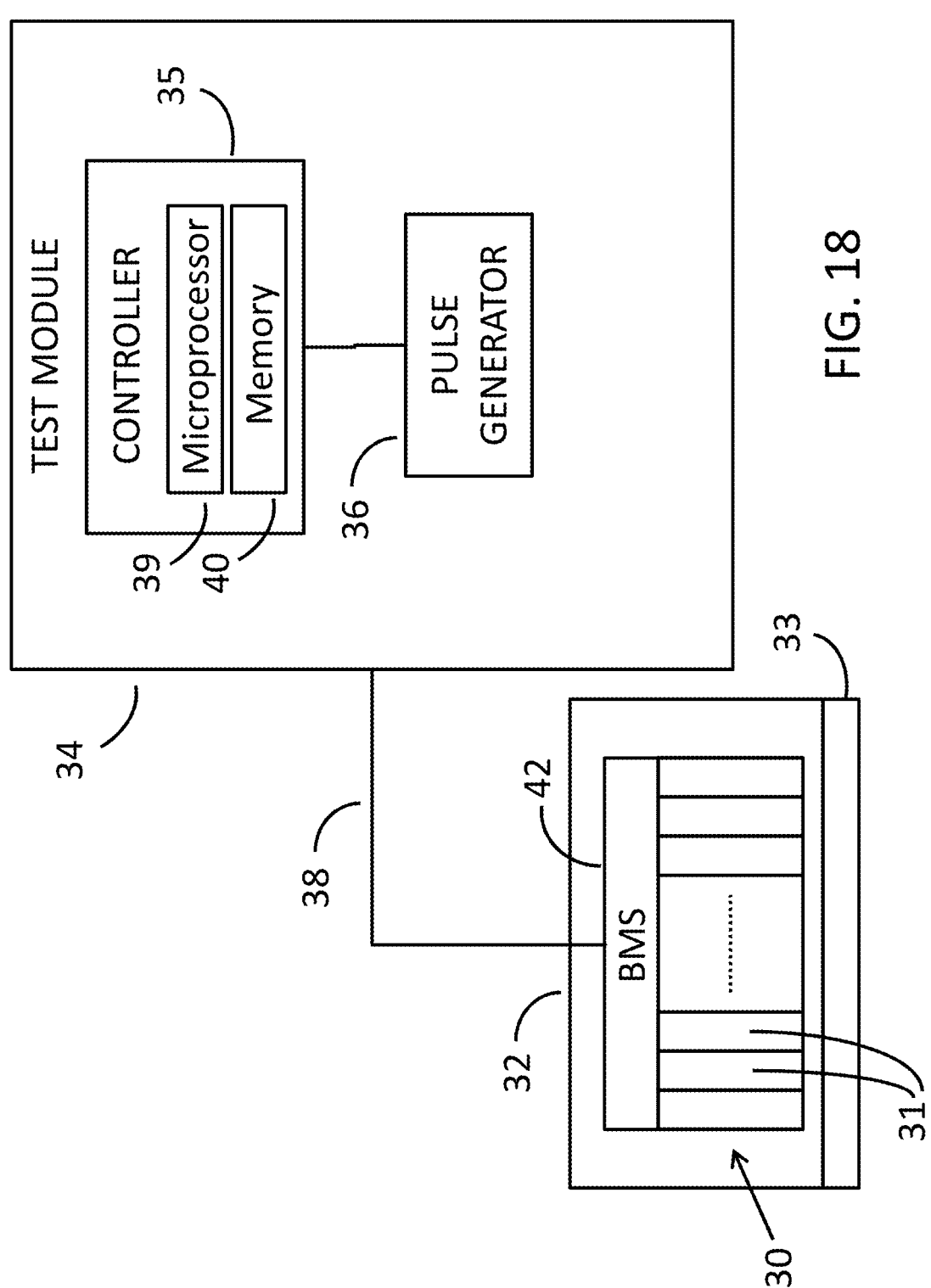
FIG. 18 is a schematic diagram of a second embodiment of the system according to the invention.

FIG. 17 is a schematic diagram of a first embodiment of the system according to the invention. A battery 30 having a plurality of cells 31 (6 are shown for convenience) 1 is disposed in a test chamber 32 with a temperature controller 33 with heating and cooling capability. Controller 33 heats or cools the battery to the desired temperature levels Γ during testing. Test module 34 carries out the diagnostic cycle (HPPC) testing described above. Pulse generator 36 generates the current pulses in the diagnostic cycle that are applied to the battery through cable 38. The measurements of the battery are conducted by voltage detector 37 and temperature detector 41 through connection to the cells of the battery through cable 38. Controller 35 controls generator 36 and detector 37 to apply the current pulses and take the cell measurements over the diagnostic cycle. In a second embodiment, as shown in FIG. 18, data from the cells (voltage, current and temperature) is provided by battery management system (BMS) 42.

Controller 35 also includes a microprocessor 39 for executing stored programs to carry out operations including extracting voltage values and voltage relations from the voltage responses, identifying model parameters of the cells having a predetermined high level of correlation to the voltage value and the voltage relation, and selecting cells, as well as the RLS, GPR and sGPR operations. Controller 35 may read the stored programs from memory 40. The microprocessor may denote any circuit such as a CPU (Central Processing Unit), a GPU (Graphics Processing Unit), an Application Specific Integrated Circuit (ASIC), or a Programmable Logic Device (e.g., a Simple Programmable Logic Device (SPLD), a Complex Programmable Logic Device (CPLD), and a Field Programmable Gate Array (FPGA).

Memory 40 stores the programs for these operations as well as one or more programs to control generator 36 and detector 37 to conduct the diagnostic cycle. Memory 40 may be, for example, a Random Access Memory (RAM), a semiconductor memory element such as a flash memory, a hard disk drive, a solid state drive, and an optical disk. Memory 40 may also include a drive device that reads and writes various information from and into a portable storage medium such as a CD-ROM drive, DVD drive, and flash memory. The memory can be a solid state memory such as NAND for nonvolatile storage of the programs.

An advantageous feature of the method and system according to the invention is scalability, both in terms of the number of cells and operating points, since the number of representative cells are independent of the total number of cells in the battery pack and estimates at a plurality of operating points (three in the above example) are used to estimate the entire parametric space.

The invention claimed is:

1. A method for assessing a state of health of a battery having a plurality of heterogeneous cells, comprising:
   subjecting the cells of the battery to a plurality of diagnostic current pulse cycles;
   identifying extreme cells based upon the cycles by measuring variations of resistance and capacitance of the cells of the battery, and determining correlations of the resistance and capacitance with respect to electrical parameters of the cells of the battery;
   estimating model parameters of the extreme cells;
   estimating upper and lower bounds for the estimated model parameters;
   using the extreme cells as representative cells and polling only the representative cells during operation of the battery having the plurality of cells, and
   wherein identifying the extreme cells comprises identifying state-of-charge invariant voltage features of the cells having a predetermined level of correlation to the electrical parameters of the cells and selecting cells having maximum and minimum values of the electrical parameters at the identified state-of-charge invariant features as the extreme cells.

2. The method according to claim 1, wherein identifying the extreme cells comprises:
   measuring respective voltage responses of the cells to the current pulse cycles,
   extracting at least one of a voltage value and a voltage relation from the voltage responses;
   identifying at least one model parameter of the cells having the predetermined level of correlation to the at least one of the voltage value and the voltage relation; and
   selecting two cells corresponding to a highest value and a lowest value of each identified model parameter as the extreme cells.

3. The method according to claim 2, wherein:
   each current pulse cycle comprises a discharge pulse followed by a charge pulse; and
   extracting at least one of the voltage value and the voltage relation from the voltage responses comprises extracting a difference between a first voltage in the voltage responses corresponding to a start of the discharge pulse and a second voltage in the voltage responses corresponding to an end of the discharge pulse as a function of an internal resistance parameter of the model of the cell.

4. The method according to claim 1, wherein estimating model parameters comprises performing a recursive least squares (RLS) analysis on the extreme cells.

5. The method according to claim 4, wherein performing the RLS analysis comprises:
   determining a first RLS model for resistive and capacitive model parameters of the extreme cells; and
   determining a second RLS model for a capacity of the extreme cells.

6. The method according to claim 1, wherein estimating the upper and lower bounds for the estimated model parameters comprises performing a sparse Gaussian process regression using the estimated model parameters.

7. The method according to claim 6, comprising performing the sparse Gaussian process regression using the estimated model parameters as a function of temperature and state of charge of the extreme cells.

8. The method according to claim 1, wherein identifying the extreme cells comprises:
   measuring respective voltage responses of the cells to the current pulse cycles,
   extracting at least one of a voltage value and a voltage relation from the voltage responses,
   identifying at least one model parameter of the cells having a predetermined high level of correlation to the at least one of the voltage value and the voltage relation, and
   selecting cells corresponding to a highest value and a lowest value of each identified model parameter as the extreme cells;
   estimating the model parameters comprises performing a recursive least squares (RLS) analysis on the extreme cells; and
   estimating the upper and lower bounds for the estimated model parameters comprises performing a sparse Gaussian process regression using the estimated model parameters.

9. The method according to claim 1, comprising estimating the model parameters of the extreme cells as a function of both temperature and state of charge.

10. The method according to claim 1, comprising estimating heterogeneous model parameters of the extreme cells as a function of both temperature and state of charge.

11. The method according to claim 1, wherein identifying the extreme cells comprises:

identifying voltage features having a highest correlation to the each of the electrical parameters.

12. The method according to claim 1, wherein the predetermined correlation is 0.9 or higher.

13. The method according to claim 1, further comprising:

heating or cooling each of the plurality cells to a plurality of temperatures; and subjecting the cells of the battery to the plurality of diagnostic current pulse cycles at each of the plurality of temperatures.

14. A system for assessing a state of health of a battery having a plurality of heterogeneous cells, comprising:

a pulse generator configured to subject the cells of the battery to a plurality of diagnostic current pulse cycles;

a voltage detector configured to measure a voltage of the cells of the battery; and processing circuitry configured to:

identify extreme cells based upon the voltages of the cells by measuring variations of resistance and capacitance of the cells of the battery, and determining correlations of the resistance and capacitance with respect to electrical parameters of the cells of the battery;

estimate model parameters of the extreme cells; and estimate upper and lower bounds for the estimated model parameters, wherein the processing circuity is further configured to identify the extreme cells by identifying state-of-charge invariant voltage features of the cells having a predetermined level of correlation to the electrical parameters of the cells and selecting cells having maximum and minimum values of the electrical parameters at the identified state-of-charge invariant features as the extreme cells, and wherein the processing circuitry is configured to control the pulse generator and voltage detector to use the extreme cells as representative cells and poll only the representative cells during operation of the battery having the plurality of cells.

15. The system according to claim 14, wherein:

the voltage detector is configured to measure respective voltage responses of the cells to the current pulse cycles; and the processing circuity is configured to:

extract at least one of a voltage value and a voltage relation from the voltage responses;

identify at least one model parameter of the cells having a predetermined high level of correlation to the at least one of the voltage value and the voltage relation; and select two cells corresponding to a highest value and a lowest value of each identified model parameter as the extreme cells.

16. The system according to claim 15, wherein:

each current pulse cycle comprises a discharge pulse followed by a charge pulse; and the processing circuitry is configured to extract a difference between a first voltage in the voltage responses corresponding to a start of the discharge pulse and a second voltage in the voltage responses corresponding to an end of the discharge pulse as a function of an internal resistance parameter of the model of the cell.

17. The system according to claim 14, wherein the processing circuitry is configured to perform a recursive least squares (RLS) analysis on the extreme cells to obtain an estimate of the model parameters of the extreme cells.

18. The system according to claim 17, wherein the processing circuitry is configured to:

determine a first RLS model for resistive and capacitive model parameters of the extreme cells; and determine a second RLS model for a capacity of the extreme cells.

19. The system according to claim 14, wherein the processing circuitry is configured to perform a sparse Gaussian process regression using the estimated model parameters to estimate the upper and lower bounds for the estimated model parameters.

20. The system according to claim 19, wherein the processing circuitry is configured to perform the sparse Gaussian process regression using the estimated model parameters as a function of temperature and state of charge of the extreme cells.

21. The system according to claim 14, wherein the voltage detector is configured to measure respective voltage responses of the cells to the current pulse cycles; and the processing circuitry is configured to:

extract at least one of a voltage value and a voltage relation from the voltage responses, identify at least one model parameter of the cells having a predetermined high level of correlation to the at least one of the voltage value and the voltage relation, select cells corresponding to a highest value and a lowest value of each identified model parameter as the extreme cells, perform a recursive least squares (RLS) analysis on the extreme cells to estimate the model parameters comprises, and perform a sparse Gaussian process regression using the estimated model parameters to estimate the upper and lower bounds for the estimated model parameters.

22. The system according to claim 14, further comprising:

a test chamber configured to hold the plurality of batteries and heat or cool the each of the plurality of batteries to a plurality of temperatures, wherein the pulse generator is configured to subject the cells of the battery to a plurality of diagnostic current pulse cycles at each of the plurality of temperatures; and the voltage detector is configured to measure a voltage of the cells of the battery at each of the plurality of temperatures.

* * * * *